US011401487B2

(12) United States Patent
Takahashi et al.

(10) Patent No.: US 11,401,487 B2
(45) Date of Patent: *Aug. 2, 2022

(54) CLEANING FORMULATION FOR REMOVING RESIDUES ON SURFACES

(71) Applicant: Fujifilm Electronic Materials U.S.A., Inc., N. Kingstown, RI (US)

(72) Inventors: Tomonori Takahashi, Shizuoka (JP); Bing Du, Gilbert, AZ (US); William A. Wojtczak, Mesa, AZ (US); Thomas Dory, Gilbert, AZ (US); Emil A. Kneer, Mesa, AZ (US)

(73) Assignee: Fujifilm Electronics Materials U.S.A., Inc., N. Kingstown, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/582,077

(22) Filed: Jan. 24, 2022

(65) Prior Publication Data

US 2022/0145222 A1   May 12, 2022

Related U.S. Application Data

(63) Continuation of application No. 16/998,352, filed on Aug. 20, 2020, now Pat. No. 11,286,444, which is a continuation of application No. 16/361,637, filed on Mar. 22, 2019, now Pat. No. 10,927,329, which is a continuation of application No. 15/386,178, filed on Dec. 21, 2016, now Pat. No. 10,253,282, which is a continuation of application No. 14/558,767, filed on Dec. 3, 2014, now Pat. No. 9,562,211.

(60) Provisional application No. 61/936,999, filed on Feb. 7, 2014, provisional application No. 61/912,697, filed on Dec. 6, 2013.

(51) Int. Cl.
| | |
|---|---|
| C11D 7/50 | (2006.01) |
| C11D 11/00 | (2006.01) |
| C11D 7/32 | (2006.01) |
| C11D 3/00 | (2006.01) |
| H01L 21/02 | (2006.01) |
| H01L 21/311 | (2006.01) |
| H01L 21/027 | (2006.01) |

(52) U.S. Cl.
CPC ........ *C11D 11/0047* (2013.01); *C11D 3/0073* (2013.01); *C11D 7/3218* (2013.01); *C11D 7/3245* (2013.01); *C11D 7/3281* (2013.01); *C11D 7/5022* (2013.01); *H01L 21/0206* (2013.01); *H01L 21/02063* (2013.01); *H01L 21/02068* (2013.01); *H01L 21/02071* (2013.01); *H01L 21/0273* (2013.01); *H01L 21/31133* (2013.01)

(58) Field of Classification Search
CPC ................................................ C11D 11/0047
USPC ...................................................... 510/175
See application file for complete search history.

(56) References Cited

U.S. PATENT DOCUMENTS

| | | |
|---|---|---|
| 5,795,702 A | 8/1998 | Tanabe et al. |
| 6,194,366 B1 | 2/2001 | Naghshineh et al. |
| 6,265,781 B1 | 7/2001 | Andreas |
| 6,287,586 B1 | 9/2001 | Orvig et al. |
| 6,303,557 B1 | 10/2001 | Colclough |
| 6,310,020 B1 | 10/2001 | Shirota et al. |
| 6,447,563 B1 | 9/2002 | Mahulikar |
| 6,599,370 B2 | 7/2003 | Skee |
| 6,627,587 B2 | 9/2003 | Naghshineh et al. |
| 6,740,589 B2 | 5/2004 | Shimazu et al. |
| 6,773,873 B2 | 8/2004 | Seijo et al. |
| 6,869,921 B2 | 3/2005 | Koito et al. |
| 6,951,710 B2 | 10/2005 | Rieker et al. |
| 6,958,312 B2 | 10/2005 | Chae et al. |
| 7,312,186 B2 | 12/2007 | Takashima et al. |
| 7,365,045 B2 | 4/2008 | Walker et al. |
| 7,387,964 B2 | 6/2008 | So et al. |
| 7,456,140 B2 | 11/2008 | Small et al. |
| 7,671,001 B2 | 3/2010 | Skee |
| 7,700,533 B2 | 4/2010 | Egbe et al. |
| 7,922,823 B2 | 4/2011 | Walker et al. |
| 8,092,707 B2 | 1/2012 | Hardy et al. |
| 8,114,220 B2 | 2/2012 | Visintin et al. |
| 8,236,485 B2 | 8/2012 | Minsek et al. |
| 8,361,237 B2 | 1/2013 | Wu et al. |
| 8,404,626 B2 | 3/2013 | Kolics et al. |

(Continued)

FOREIGN PATENT DOCUMENTS

| | | |
|---|---|---|
| CN | 1488740 | 4/2004 |
| CN | 1875325 | 12/2006 |

(Continued)

OTHER PUBLICATIONS

Notice of Reasons for Refusal issued by the Japanese Patent Office for Application No. JP 2021-044568, dated Mar. 1, 2022 (with English Translation).
Chinese Office Action for Chinese Application No. 201480066376.0, dated Dec. 28, 2017, 7 pages (with English Translation).
Chinese Office Action for Chinese Application No. 201480066376.0, dated Jun. 7, 2017, 16 pages (with English Translation).
European Office Action for European Application No. 14855311.8 dated Jul. 4, 2017 (8 pages).

(Continued)

*Primary Examiner* — Gregory E Webb
(74) *Attorney, Agent, or Firm* — Fish & Richardson P.C.

(57) ABSTRACT

This disclosure relates to a cleaning composition that contains 1) at least one redox agent; 2) at least one first chelating agent, the first chelating agent being a polyaminopolycarboxylic acid; 3) at least one metal corrosion inhibitor, the metal corrosion inhibitor being a substituted or unsubstituted benzotriazole; 4) at least one pH adjusting agent, the pH adjusting agent being a base free of a metal ion; and 5) water. This disclosure also relates to a method of using the above composition for cleaning a semiconductor substrate.

28 Claims, No Drawings

(56) References Cited

U.S. PATENT DOCUMENTS

| | | | |
|---|---|---|---|
| 9,045,717 B2 | 6/2015 | Nakanishi et al. | |
| 9,562,211 B2* | 2/2017 | Takahashi | H01L 21/31133 |
| 10,253,282 B2 | 4/2019 | Takahashi et al. | |
| 10,415,005 B2 | 9/2019 | Takahashi et al. | |
| 10,533,146 B2 | 1/2020 | Park et al. | |
| 10,696,933 B2 | 6/2020 | Takahashi et al. | |
| 10,927,329 B2 | 2/2021 | Takahashi et al. | |
| 2001/0025017 A1 | 9/2001 | Amemiya et al. | |
| 2002/0077259 A1 | 6/2002 | Skee | |
| 2003/0228990 A1 | 12/2003 | Lee et al. | |
| 2003/0232799 A1 | 12/2003 | Wang et al. | |
| 2004/0048761 A1 | 3/2004 | Ikemoto | |
| 2004/0134873 A1 | 7/2004 | Yao et al. | |
| 2005/0176602 A1 | 8/2005 | Hsu | |
| 2005/0263743 A1 | 12/2005 | Lee | |
| 2006/0014391 A1 | 1/2006 | Lee et al. | |
| 2006/0014656 A1* | 1/2006 | Egbe | G03F 7/425 257/E21.255 |
| 2006/0094613 A1 | 5/2006 | Lee | |
| 2006/0115970 A1 | 6/2006 | Lee et al. | |
| 2006/0293208 A1 | 12/2006 | Egbe et al. | |
| 2007/0060490 A1 | 3/2007 | Skee | |
| 2007/0235061 A1 | 10/2007 | Mizuta et al. | |
| 2008/0004197 A1 | 1/2008 | Kneer | |
| 2008/0026583 A1 | 1/2008 | Hardy et al. | |
| 2008/0051308 A1 | 2/2008 | Kane | |
| 2008/0076688 A1 | 3/2008 | Barnes et al. | |
| 2008/0139436 A1 | 6/2008 | Reid | |
| 2008/0214006 A1 | 9/2008 | Lee et al. | |
| 2009/0107520 A1 | 4/2009 | Lee et al. | |
| 2009/0120457 A1 | 5/2009 | Naghshineh et al. | |
| 2009/0203566 A1 | 8/2009 | Lee et al. | |
| 2009/0281017 A1 | 11/2009 | Suzuki et al. | |
| 2009/0286708 A1 | 11/2009 | Murakami et al. | |
| 2009/0301996 A1 | 12/2009 | Visintin et al. | |
| 2010/0043823 A1* | 2/2010 | Lee | H01L 21/02057 134/1.3 |
| 2010/0056409 A1 | 3/2010 | Walker et al. | |
| 2010/0152086 A1 | 6/2010 | Wu et al. | |
| 2010/0163788 A1 | 7/2010 | Visintin et al. | |
| 2011/0076852 A1 | 3/2011 | Takahashi et al. | |
| 2011/0237480 A1* | 9/2011 | Mizutani | H01L 21/02076 510/175 |
| 2012/0021961 A1 | 1/2012 | Klipp et al. | |
| 2012/0048295 A1 | 3/2012 | Du et al. | |
| 2012/0090646 A1 | 4/2012 | Tanaka et al. | |
| 2012/0283163 A1 | 11/2012 | Barnes et al. | |
| 2013/0061882 A1 | 3/2013 | Wu et al. | |
| 2013/0288436 A1 | 10/2013 | Chou et al. | |
| 2013/0296214 A1 | 11/2013 | Barnes et al. | |
| 2013/0296215 A1 | 11/2013 | Rao et al. | |
| 2014/0109931 A1* | 4/2014 | Lee | C11D 7/3218 510/176 |
| 2016/0130500 A1 | 5/2016 | Chen et al. | |
| 2019/0241845 A1 | 8/2019 | Takahashi et al. | |
| 2020/0048584 A1 | 2/2020 | Takahashi et al. | |
| 2020/0377829 A1 | 12/2020 | Takahashi et al. | |

FOREIGN PATENT DOCUMENTS

| | | | |
|---|---|---|---|
| CN | 1904016 | 1/2007 | |
| CN | 101916052 | 12/2010 | |
| CN | 102031204 | 4/2011 | |
| CN | 102477359 A | 5/2012 | |
| CN | 102770524 | 11/2012 | |
| DE | 198 49 648 | 5/2000 | |
| EP | 1 755 003 | 2/2007 | |
| EP | 2 305 788 | 4/2011 | |
| EP | 2 500 407 | 9/2012 | |
| EP | 3 104 398 | 12/2016 | H01L 21/311 |
| GB | 1 347 008 | 2/1974 | |
| JP | H 03-000799 | 1/1991 | |
| JP | H 11-006088 | 1/1999 | |
| JP | 2003-15323 | 1/2003 | |
| JP | 2004-511917 | 4/2004 | |
| JP | 2005-223030 | 8/2005 | |
| JP | 2005-528660 | 9/2005 | |
| JP | 2007-003617 | 1/2007 | |
| JP | 2007-531902 | 11/2007 | |
| JP | 2008-528762 | 7/2008 | |
| JP | 2009-542849 | 12/2009 | |
| JP | 2010-515246 | 5/2010 | |
| JP | 2010-147476 | 7/2010 | |
| JP | 2010-537404 | 12/2010 | |
| JP | 2011-80042 | 4/2011 | |
| JP | 2011-94100 | 5/2011 | |
| JP | 2011-204909 | 10/2011 | |
| JP | 2012-009513 | 1/2012 | |
| JP | 2012-021151 A2 | 2/2012 | |
| JP | 2012-033774 | 2/2012 | |
| JP | 2012-046685 | 3/2012 | |
| JP | 2012-195590 | 10/2012 | |
| JP | 2013-104104 A2 | 5/2013 | |
| KR | 2004-0023517 | 3/2004 | |
| KR | 1020120106928 | 9/2012 | |
| TW | 1227271 | 2/2005 | |
| TW | 200710610 A | 3/2007 | |
| TW | 1315030 | 9/2009 | |
| TW | 201137117 A | 11/2011 | |
| TW | 1362571 | 4/2012 | |
| WO | WO 98/049723 | 11/1998 | |
| WO | WO 2000/014193 | 3/2000 | |
| WO | WO 2002/33033 | 4/2002 | |
| WO | WO 2003/040252 A2 | 5/2003 | |
| WO | WO 03/091376 | 11/2003 | C11D 3/20 |
| WO | WO 2006/039090 | 4/2006 | C23G 1/00 |
| WO | WO 2007/027522 | 3/2007 | |
| WO | WO 2009/146606 | 12/2009 | |
| WO | WO 2012/161790 A1 | 11/2012 | |
| WO | WO 2013/058770 A1 | 4/2013 | |
| WO | WO 2013/101907 | 7/2013 | |
| WO | WO 2014/197808 | 12/2014 | |

OTHER PUBLICATIONS

European Search Report for European Application No. EP 16178830 dated Oct. 13, 2016 (2 pages).
International Search Report and the Written Opinion of the International Searching Authority for International Application No. PCT/US2014/055556 dated Dec. 22, 2014.
Korean Office Action for South Korean Application No. 10-2016-7015325 dated Feb. 13, 2018, 23 pages (with English Translation).
Notice of Reasons for Rejection from the Japanese Patent Office for Japanese Application No. 2016-536210 dated Oct. 17, 2017, 6 pages (with English Translation).
South Korean Office Action for South Korean Application No. 10-2016-7015325 dated Aug. 28, 2018 (with English translation), 19 pages.
Supplementary European Search Report for European Application No. EP 14855311 dated Jun. 8, 2017 (3 pages).
Supplementary European Search Report from the European Patent Office for European Application No. EP 14867771 dated Aug. 31, 2017, 2 pages.
Taiwan Office Action for Taiwan Application No. 103132272, dated Dec. 12, 2017, 10 pages (Foreign language document).
Taiwan Official Letter and Search Report for Taiwan Application No. 107146987 dated Jun. 19, 2019 (with English translation).
Taiwan Search Report for Taiwan Application No. 103142384 dated May 31, 2017 (1 page).
Chinese Office Action for Chinese Application No. CN 201810223834.7 dated Jun. 18, 2020 (with English Translation).
Chinese Office Action for Chinese Application No. CN 201810223834.7 dated Sep. 3, 2019 with Machine Translation.
Decision to Grant a Patent for Japanese Application No. JP 2016-525614, dated Sep. 3, 2019, 2 pages (English translation).
European Office Action for European Application No. EP 16 178 8730.2 dated Oct. 31, 2018, 7 pages.
European Search Report for European Application No. EP 20 16 2184, dated Aug. 14, 2020.

(56) References Cited

OTHER PUBLICATIONS

Final Office Action issued by the South Korean Patent Office for Application No. KR 10-2020-7008354 dated Dec. 18, 2020 (with English Translation).
International Search Report and Written Opinion of the International Searching Authority for International Application No. PCT/US14/68294 dated Feb. 25, 2015 (18 pages).
Korean Final Office Action for Korean Application No. KR 10-2019-7008832 dated Oct. 30, 2019 and English summary.
Korean Office Action for Korean Application No. 10-2019-7008832 dated Apr. 29, 2019.
Korean Office Action for Korean Application No. KR 10-2019-7008832 dated Dec. 24, 2019 (with English Translation).
Korean Office Action for Korean Application No. KR 10-2020-7008354 dated Jun. 19, 2020 (with English Translation).
Notice of Reasons for Refusal for Japanese Application No. 2019-039176, dated Jun. 16, 2020 (with English Translation).
Notice of Reasons for Refusal for Japanese Application No. JP 2016-525614, dated Jun. 4, 2019, 3 pages (English translation).
Notice of Reasons for Refusal for Japanese Application No. JP 2016-525614, dated Sep. 4, 2018, 3 pages (English translation).
Notice of Reasons for Refusal for Japanese Application No. JP 2019-039176 dated Jan. 14, 2020 (with English Translation).
Notification of Reasons for Refusal issued by the Korean Patent Office for Application No. KR 10-2021-7021104 dated Oct. 22, 2021 (with English Translation).
Office Action issued by the Korean Patent Office for Korean Application No. KR 10-2020-7008354 dated Apr. 13, 2021 (with English Translation).
Taiwan Search Report for Taiwan Application No. 106139015 dated Aug. 15, 2018, 1 page.
Petition for Post Grant Review of U.S. Pat. No. 10,927,329 filed before the Patent Trial and Appeal Broad, *Tokyo Ohka Kogyo Co., Ltd.* v. *FujiFilm Electronic Materials U.S.A., Inc.*, PGR2022-00010 (Nov. 22, 2021).
Curriculum Vitae of Alexander D. Glew, Ph.D., P.E.
"Declaration of Alexander Glew, Ph.D. in Support of Petition for Post Grant Review of U.S. Pat. No. 10,927,329", *Tokyo Ohka Kogyo Co., Ltd.* v. *FujiFilm Electronic Materials U.S.A., Inc,*. before the Patent Trial and Appeal Board, Case No. PGR2022-00010, dated Nov. 22, 2021.
"Tokyo Ohka Kogyo Co., LTD. Receives Intel's Preferred Quality Supplier Award", 2016 News Release (2016).
"Intel 2020 Supplier Continuous Quality Improvement Awards", Intel Newsroom, (Mar. 30, 2021).
"Intel Announces 2019 Supplier Continuous Quality Improvement Awards", Intel Newsroom, (Mar. 5, 2020).
"Intel Announces 2018 Supplier Continuous Quality Improvement Awards", Intel Newsroom, (Mar. 7, 2019).
Prosecution History excerpt for EP 3 104 398 A1.
Reinhardt et al., Handbook of Cleaning for Semiconductor Manufacturing—Fundamentals and. Applications, Scrivener Publishing LLC, pp. 327-354 (2011).
Van Zant, P., Microchip Fabrication—A Practical Guide to Semiconductor Processing, $5^{th}$ Edition,. McGraw-Hill Companies, Inc. New York, pp. 25-49; 71-137 (2004).
Curriculum Vitae of Dr. Reinhold H. Dauskardt.
Declaration of Reinhold H. Dauskardt filed with the United States Patent and Trademark Office Before the Patent Trial and Appeal Board, *Tokyo Ohka Kogyo Col. Ltd.*, Petitioner, v. *FujiFilm Electronic Materials U.S.A., Inc.*, Patent Owner, Case No. PGR2022-00010; Patent No. 10,927,329, Dated Mar. 7, 2022.
File History excerpt of U.S. Appl. No. 14/558,767.
File History excerpt for U.S. Pat. No. 10,927,329.
He et al., "Mechanism of Co Liner as Enhancement Layer for Cu Interconnect Gap-Fill", Journal of the Electrochemical Society, vol. 160, No. 12, pp. D3040-D3044 (2013).
International Technology Roadmap for Semiconductors 2.0 2015 Edition Interconnect (2015).
Patent Owner Preliminary Response Pursuant to 37 C.F.R. § 42.207 filed with the United States Patent and Trademark Office Before the Patent Trial and Appeal Board, *Tokyo Ohka Kogyo Col. Ltd.*, Petitioner, v. *FujiFilm Electronic Materials U.S.A., Inc.*, Patent Owner, Case No. PGR2022-00010; U.S. Pat. No. 10,927,329, filed on Mar. 8, 2022.
Patent Owner's Sur-Reply to Petitioner's Reply filed with the United States Patent and Trademark Office Before the Patent Trial and Appeal Board, *Tokyo Ohka Kogyo Col. Ltd.*, Petitioner, v. *FujiFilm Electronic Materials U.S.A., Inc.*, Patent Owner, Case No. PGR2022-00010; U.S. Pat. No. 10,927,329, filed on Apr. 14, 2022.
Reply on Topics of Discretionary Denial Under 325(d) and Claim Construction filed with the United States Patent and Trademark Office Before the Patent Trial and Appeal Board, *Tokyo Ohka Kogyo Col. Ltd.*, Petitioner, v. *FujiFilm Electronic Materials U.S.A., Inc.*, Patent Owner, Case No. PGR2022-00010; U.S. Pat. No. 10,927,329, Filed on Apr. 7, 2022.
Schor, "IEDM 2017 + ISSCC 2018: Intel's 10nm, switching to cobalt interconnects", WikiChip Fuse, (Feb. 17, 2018), available at: https://fuse.wikichip.org/news/525/iedm-2017-isscc-2018-intels-10nmswitching-to-cobalt-interconnects/2/.
Wolf et al., "Chapter 5, Contamination Control and Cleaning Technology for ULSI", Silicon Processing for the VLSI Era, vol. 1, Process Technology, Second Edition, Lattice Press, Sunset Beach, CA (2006).
Decision Granting Institution of Post-Grant Review issued by the United States Patent and Trademark Office Before the Patent Trial and Appeal Board, Tokyo Ohka Kogyo Co., Ltd., Petitioner, v. FujiFilm Electronic Materials U.S.A., Inc., Patent Owner, Case No. PGR2022-00010; U.S. Pat. No. 10,927,329, dated Jun. 6, 2022.

\* cited by examiner

CLEANING FORMULATION FOR REMOVING RESIDUES ON SURFACES

CROSS-REFERENCE TO RELATED APPLICATIONS

The present application is a continuation of and claims priority to U.S. application Ser. No. 16/998,352, filed on Aug. 20, 2020, which is a continuation of and claims priority to U.S. application Ser. No. 16/361,637, filed on Mar. 22, 2019, now U.S. Pat. No. 10,927,329, which is a continuation of and claims priority to U.S. application Ser. No. 15/386,178, filed on Dec. 21, 2016, now U.S. Pat. No. 10,253,282, which is a continuation of and claims priority to U.S. application Ser. No. 14/558,767, filed on December 3, 2014, now U.S. Pat. No. 9,562,211, which claims priority to U.S. Provisional Application Ser. No. 61/936,999, filed on Feb. 7, 2014, and U.S. Provisional Application Ser. No. 61/912,697, filed on Dec. 6, 2013. The contents of the prior applications are hereby incorporated by reference in their entirety.

BACKGROUND

1. Field of the Disclosure

The present disclosure relates to a novel cleaning composition for semiconductor substrates and a method of cleaning semiconductor substrates. More particularly, the present disclosure relates to a cleaning composition for removing plasma etch residues formed on semiconductor substrates after plasma etching of metal layers or dielectric material layers deposited on the substrates and the removal of residues left on the substrates after bulk resist removal via a plasma ashing process.

2. Discussion of the Background Art

In the manufacture of integrated circuit devices, photoresists are used as an intermediate mask for transferring the original mask pattern of a reticle onto the wafer substrate by means of a series of photolithography and plasma etching steps. One of the essential steps in the integrated circuit device manufacturing process is the removal of the patterned photoresist films from the wafer substrate. In general, this step is carried out by one of two methods.

One method involves a wet stripping step in which the photoresist-covered substrate is brought into contact with a photoresist stripper solution that consists primarily of an organic solvent and an amine. However, stripper solutions cannot completely and reliably remove the photoresist films, especially if the photoresist films have been exposed to UV radiation and plasma treatments during fabrication. Some photoresist films become highly crosslinked by such treatments and are more difficult to dissolve in the stripper solution. In addition, the chemicals used in these conventional wet-stripping methods are sometimes ineffective for removing inorganic or organometallic residual materials formed during the plasma etching of metal or oxide layers with halogen-containing gases.

An alternative method of removing a photoresist film involves exposing a photoresist-coated wafer to oxygen-based plasma in order to burn the resist film from the substrate in a process known as plasma ashing. However, plasma ashing is also not fully effective in removing the plasma etching by-products noted above. Instead, removal of these plasma etch by-products is typically accomplished by subsequently exposing the processed metal and dielectric thin films to certain cleaning solutions.

Metal substrates are generally susceptible to corrosion. For example, substrates such as aluminum, copper, aluminum-copper alloy, tungsten nitride, tungsten (W), cobalt (Co), titanium oxide, other metals and metal nitrides, will readily corrode and dielectrics [ILD, ULK] can etch by using conventional cleaning chemistries. In addition the amount of corrosion tolerated by the integrated circuit device manufacturers is getting smaller and smaller as the device geometries shrink.

At the same time as residues become harder to remove and corrosion must be controlled to ever lower levels, cleaning solutions must be safe to use and environmentally friendly.

Therefore, the cleaning solution should be effective for removing the plasma etch and plasma ash residues and must also be non-corrosive to all exposed substrate materials.

SUMMARY OF THE DISCLOSURE

The present disclosure is directed to a non-corrosive cleaning composition that is useful primarily for removing residues (e.g., plasma etch and/or plasma ashing residues) from a semiconductor substrate as an intermediate step in a multistep manufacturing process. These residues include a range of relatively insoluble mixtures of organic compounds like residual photoresist, organometallic compounds, metal oxides which are formed as reaction by-products from exposed metals such as aluminum, aluminum/copper alloy, copper, titanium, tantalum, tungsten, cobalt, metal nitrides such as titanium and tungsten nitrides, and other materials. An advantage of the cleaning composition described herein is that it can clean a broad range of residues encountered and be generally non-corrosive to exposed substrate materials (e.g., exposed metals such as aluminum, aluminum/copper alloy, copper, titanium, tantalum, tungsten, cobalt, and metal nitrides such as titanium and tungsten nitrides).

In one aspect, the present disclosure features a cleaning composition containing 1) at least one redox agent, 2) at least one first chelating agent, the first chelating agent being a polyaminopolycarboxylic acid, 3) at least one second chelating agent different from the first chelating agent, the second chelating agent containing at least two nitrogen-containing groups, 4) at least one metal corrosion inhibitor, the metal corrosion inhibitor being a substituted or unsubstituted benzotriazole, 5) at least one organic solvent selected from the group consisting of water soluble alcohols, water soluble ketones, water soluble esters, and water soluble ethers, 6) water, and 7) optionally, at least one pH adjusting agent, the pH adjusting agent being a base free of a metal ion. In some embodiments, the pH of the cleaning composition is between about 6 and about 11 (e.g., between about 6 and about 9.5). In some embodiments, the cleaning composition is a uniform solution.

For example, the cleaning composition can include:
1) about 0.5% to about 20% by weight of at least one redox agent;
2) about 0.01% to about 1% by weight of at least one first chelating agent;
3) about 0.01% to about 1.8% by weight of at least one second chelating agent;
4) about 0.05% to about 1% by weight of at least one metal corrosion inhibitor;
5) about 1% to about 30% by weight of at least one organic solvent;
6) about 78% to about 98% water, and
7) optionally, at least one pH adjusting agent.

The present disclosure is also directed to a method of cleaning residues from a semiconductor substrate. The method includes contacting a semiconductor substrate containing post etch residues and/or post ash residues with a cleaning composition described herein. For example, the method can include the steps of:

(A) providing a semiconductor substrate containing post etch and/or post ash residues;
(B) contacting said semiconductor substrate with a cleaning composition described herein;
(C) rinsing said semiconductor substrate with a suitable rinse solvent; and
(D) optionally, drying said semiconductor substrate by any means that removes the rinse solvent and does not compromise the integrity of said semiconductor substrate.

DETAILED DESCRIPTION OF THE DISCLOSURE

As defined herein, unless otherwise noted, all percentages expressed should be understood to be percentages by weight to the total weight of the cleaning composition. Unless otherwise noted, ambient temperature is defined to be between about 16 and about 27 degrees Celsius (° C.).

As defined herein, a "water-soluble" substance (e.g., a water-soluble alcohol, ketone, ester, or ether) refers to a substance having a solubility of at least 5% by weight in water at 25° C.

One embodiment of the present disclosure is directed to a non-corrosive cleaning composition comprising:
1) about 0.5% to about 20% by weight of at least one redox agent;
2) about 0.01% to about 1% by weight of at least one first chelating agent, the first chelating agent being a polyaminopolycarboxylic acid;
3) about 0.01% to about 1.8% by weight of at least one second chelating agent different from the first chelating agent, the second chelating agent containing at least two nitrogen-containing groups,
4) about 0.05% to about 1% by weight of at least one metal corrosion inhibitor selected from the group consisting of substituted and unsubstituted benzotriazoles;
5) about 1% to about 30% by weight of at least one organic solvent selected from the group consisting of water soluble alcohols, water soluble ketones, water soluble esters, and water soluble ethers;
6) about 78% to about 98% water, and
7) optionally, at least one pH adjusting agent, the pH adjusting agent being a base free of a metal ion and adjusting the pH of the cleaning composition to between about 6 and about 9.5.

The compositions of this disclosure contain at least one redox agent, which aids in the dissolution of residues on the semiconductor surface such as photoresist residues, metal residues, and metal oxide residues. As used herein, the term "redox agent" refers to a compound that can induce an oxidation and a reduction in a semiconductor cleaning process. An example of a suitable redox agent is hydroxylamine. In some embodiments, the redox agent does not include a peroxide (e.g., hydrogen peroxide).

In some embodiments, the compositions of this disclosure include at least about 0.5% by weight (e.g., at least about 1% by weight, at least about 2% by weight, at least about 3% by weight, or at least about 5% by weight) and/or at most about 20% by weight (e.g., at most about 17% by weight, at most about 15% by weight, at most about 12% by weight, or at most about 10% by weight) of the redox agent.

The compositions of this disclosure contain at least one first chelating agent, which can be a polyaminopolycarboxylic acid. For the purposes of this disclosure, a polyaminopolycarboxylic acid refers to a compound with a plurality of amino groups and a plurality of carboxylic acid groups. Suitable classes of polyaminopolycarboxylic acid chelating agents include, but are not limited to mono- or polyalkylene polyamine polycarboxylic acids, polyaminoalkane polycarboxylic acids, polyaminoalkanol polycarboxylic acids, and hydroxyalkylether polyamine polycarboxylic acids.

Suitable polyaminopolycarboxylic acid chelating agents include, but are not limited to, butylenediaminetetraacetic acid, diethylenetriaminepentaacetic acid (DTPA), ethylenediaminetetrapropionic acid, triethylenetetraminehexaacetic acid, 1,3-diamino-2-hydroxypropane-N, N, N', N'-tetraacetic acid, propylenediaminetetraacetic acid, ethylenediaminetetraacetic acid (EDTA), trans-1,2-diaminocyclohexane tetraacetic acid, ethylendiamine diacetic acid, ethylendiamine dipropionic acid, 1,6-hexamethylene-diamine-N,N,N', N'-tetraacetic acid, N,N-bis(2-hydroxybenzyl)ethylenediamine-N,N-diacetic acid, diaminopropane tetraacetic acid, 1,4,7,10-tetraazacyclododecane-tetraacetic acid, diaminopropanol tetraacetic acid, and (hydroxyethyl) ethylene-diaminetriacetic acid.

In some embodiments, the compositions of this disclosure include at least about 0.01% by weight (e.g., at least about 0.1% by weight, at least about 0.2% by weight or at least about 0.3% by weight) and/or at most about 1% by weight (e.g., at most about 0.7% by weight, at most about 0.6% by weight or at most about 0.5% by weight) of the polyaminopolycarboxylic acid chelating agent.

In general, the compositions of this disclosure can contain at least one second chelating agent having at least 2 nitrogen containing groups (e.g., nitrogen containing groups with chelating ability). Examples of suitable nitrogen containing groups include primary amino, secondary amino, imidazolyl, triazolyl, benzotriazolyl, piperazinyl, pyrolyl, pyrrolidinyl, pyrazolyl, piperidinyl, guanidinyl, biguanidinyl, carbazatyl, hydrazidyl, semicarbazidyl, and aminoguanidinyl. Compounds with combinations of any two or more of these groups are contemplated. The second chelating agent having at least 2 nitrogen containing groups may be added as the compound itself, or as its neutralized salt. In some embodiments, the second chelating agent is optional in the compositions of this disclosure.

For the purposes of this disclosure, the polyaminopolycarboxylic acids are excluded from the second chelating agent. In other words, the second chelating agent is different from the first chelating agent. However, in some embodiments, the second chelating agent may include one or more carboxylic acid groups.

For example, the second chelating agent can be a monocarboxylic acid compound containing a primary or secondary amino group and at least one additional nitrogen-containing basic group. For the purpose of this disclosure, the required primary or secondary amino group is not directly bonded to nor part of the additional nitrogen containing basic group (e.g. $NH_2$, $H_2NC(=X)$, or $H_2NNHC(=X)$, where X=O, S, or NR, R being H or $C_1$-$C_4$ alkyl). In other words, $NH_2NH-$, $H_2NC(=X)NH-$, or $H_2NNHC(=X)NH-$ are not considered the primary or secondary amino group within this disclosure. Thus, a monocarboxylic acid containing such a basic group only (e.g., $NH_2NH-$, $H_2NC(=X)NH-$, or $H_2NNHC(=X)NH-$) does not include a primary or secondary amino group and is therefore excluded from the monocarboxylic acid compound containing a primary or secondary amino group and at least one additional nitrogen-containing basic group described in this disclosure. Examples of such excluded monocarboxylic acids include guanidinoacetic acid and 4-guanidinobutyric acid.

Suitable classes of monocarboxylic acid compound containing a primary or secondary amino group and at least one additional nitrogen-containing basic group are those monocarboxylic acid compounds which contain a primary or secondary amino group and at least one of the following nitrogen-containing basic groups selected from the group consisting of imidazolyl, triazolyl, benzotriazolyl, piperazinyl, pyrolyl, pyrrolidinyl, pyrazolyl, piperidinyl, guanidinyl, carbazatyl, hydrazidyl, sem icarbazidyl, aminoguanidinyl, primary amino (e.g., $C_1$-$C_{10}$ primary amino), and secondary amino (e.g., $C_1$-$C_{10}$ secondary amino). These groups may be further substituted with substituents, e.g. lower alkyl groups, except for the secondary amino group.

In some embodiments of the disclosure, the at least one monocarboxylic acid compound containing a primary or secondary amino group and at least one additional nitrogen-containing basic group is selected from the compounds described by the generic Structure (I):

$$(R^3NH)C(R^1)(R^2)CO_2H \qquad (I),$$

in which each of $R^1$ and $R^2$, independently, is a hydrogen atom, $C_1$-$C_4$ alkyl, or a group (e.g., a $C_1$-$C_{10}$ group) having at least one nitrogen-containing basic group; and $R^3$ is a hydrogen atom, $C_1$-$C_{10}$ alkyl, or a group (e.g., a $C_1$-$C_{10}$ group) having at least one nitrogen-containing basic group; in which at least one of $R^1$, $R^2$, and $R^3$ is a group having at least one nitrogen-containing basic group.

In some embodiments, $R^1$ can be a group having at least one nitrogen-containing basic group, in which the group having at least one nitrogen-containing basic group is $C_1$-$C_{10}$ alkyl substituted by amino, guanidinyl, or imidazolyl and optionally further substituted by OH. In such embodiments, $R^2$ can be H or $C_1$-$C_{10}$ alkyl and $R^3$ can be H, $C_1$-$C_{10}$ alkyl, or a group having at least one nitrogen-containing basic group, in which the group having at least one nitrogen-containing basic group is $C_1$-$C_{10}$ alkyl optionally substituted by amino, guanidinyl, or imidazolyl and optionally further substituted by OH.

In some embodiments, $R^3$ can be a group having at least one nitrogen-containing basic group, in which the group having at least one nitrogen-containing basic group is $C_1$-$C_{10}$ alkyl substituted by amino, guanidinyl, or imidazolyl and optionally further substituted by OH. In such embodiments, each of $R^1$ and $R^2$, independently, can be H or $C_1$-$C_4$ alkyl.

In some embodiments of the disclosure, the at least one monocarboxylic acid compound containing a primary or secondary amino group and at least one additional nitrogen-containing basic group is selected from the compounds of Structure (I) described above, where $R^1$ is a group having at least one nitrogen-containing basic group and each of $R^2$ and $R^3$ is a hydrogen atom. Examples of compounds having this structure include, but are not limited to, lysine, 2,3-diaminobutyric acid, 2,4-diam inobutyric acid, ornithine, 2,3-diaminopropionic acid, 2,6-diaminoheptanoic acid, 4-methyl lysine, 3-methyl lysine, 5-hydroxylysine, 3-methyl-L-arginine, arginine, homoarginine, $N^5$-monomethyl-L-arginine, $N^5$-[imino(methylamino)methyl]-D-ornithine, canavanine, and histidine.

In some embodiments of the disclosure, the at least one monocarboxylic acid compound containing a primary or secondary amino group and at least one additional nitrogen-containing basic group is selected from the compounds described by Structure (I) described above, where each of $R^1$ and $R^2$ is a hydrogen atom, and $R^3$ is a $C_1$-$C_{10}$ group containing a group having at least one nitrogen-containing basic group. Examples of compounds having this structure include, but are not limited to, N-(2-aminoethyl)glycine and N-(2-aminopropyl)glycine.

In some embodiments of the disclosure, the at least one monocarboxylic acid compound containing a primary or secondary amino group and at least one additional nitrogen-containing basic group is selected from the compounds described by Structure (I) described above, where $R^1$ is a group having at least one nitrogen-containing basic group, $R^2$ is a hydrogen atom, and $R^3$ is a $C_1$-$C_{10}$ alkyl group. Examples of compounds having this structure include, but are not limited to, N2-methyl lysine, and N2-methyl-L-Arginine.

In some embodiments of the disclosure, the at least one monocarboxylic acid compound containing a primary or secondary amino group and at least one additional nitrogen-containing basic group is selected from the monocarboxylic acid compounds described by Structure (I) described above, where $R^1$ is a group having at least one nitrogen-containing basic group, $R^2$ is a hydrogen atom, and $R^3$ is a group having at least one nitrogen-containing basic group. Examples of compounds having this structure includes, but are not limited to, $N^2$-(2-aminoethyl)-D-arginine, and $N^2$-(2-aminoethyl)-L-arginine.

In some embodiments of the disclosure, the at least one monocarboxylic acid compound containing a primary or secondary amino group and at least one additional nitrogen-containing basic group is selected from the monocarboxylic acid compounds described by Structure (I) described above, where $R^1$ is a $C_1$-$C_4$ alkyl, $R^2$ is a group having at least one nitrogen-containing basic group, and $R^3$ is a hydrogen atom. Examples of compounds having this structure include, but are not limited to, 2-methyllysine and 2-methyl-L-arginine.

In some embodiments of the disclosure, the at least one monocarboxylic acid compound containing a primary or secondary amino group and at least one additional nitrogen-containing basic group is selected from the monocarboxylic acid compounds that have a structure where the required primary or secondary amino group is not bonded to the same carbon as the carboxyl group. Examples of compounds having this structure include, but are not limited to, 3,4-diaminobutyric acid and 3-amino-5-[(aminoiminomethyl)methylamino] pentanoic acid.

In some embodiments, the second chelating agent can include biguanide groups. For example, the second chelating agent can have the following Structure (II):

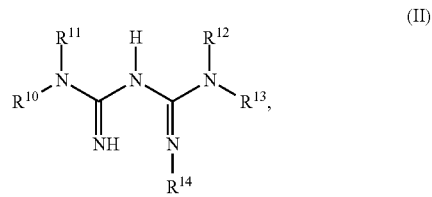

in which $R^{10}$, $R^{11}$, $R^{12}$, and $R^{13}$ are independently selected from the group consisting of hydrogen, substituted or unsubstituted aryl, substituted or unsubstituted $C_3$-$C_{10}$ cyclic alkyl, and substituted or unsubstituted $C_1$-$C_{10}$ linear or branched alkyl; and $R^{14}$ is hydrogen or a single bond that together with $R^{13}$ forms an imidazole ring; provided that at least one of $R^{10}$, $R^{11}$, $R^{12}$, and $R^{13}$ is an aryl group or contains an aryl substituent and that at least two of $R^{10}$, $R^{11}$, $R^{12}$, and $R^{13}$ are hydrogen. In some embodiments, $R^{11}$ and $R^{13}$ are hydrogen. In some embodiments, $R^{13}$ and $R^{14}$ are hydrogen.

Examples of suitable aryl groups for $R^{10}$-$R^{13}$ include, but are not limited to phenyl, napthyl, and anthracenyl. Suitable substituents include, but are not limited to halogen (e.g., Cl, Br, or F), $C_1$-$C_{10}$ linear or branched alkyl, $C_3$-$C_{10}$ cyclic alkyl, $C_1$-$C_{10}$ linear or branched alkoxy, $C_3$-$C_{10}$ cyclic alkoxy, nitro, SH, dioxolyl, and substituted or unsubstituted phenyl.

Examples of suitable substituted or unsubstituted $C_3$-$C_{10}$ cyclic alkyl for $R^{10}$-$R^{13}$ include, but are not limited to cyclobutyl, cyclopentyl, cyclohexyl, cycloheptyl, and bicyclic systems such as norbornyl and fully hydrogenated naphthylene. Suitable substituents included, but are not limited to, halogen (e.g., Cl, Br, or F), $C_1$-$C_{10}$ linear or branched alkyl, $C_3$-$C_{10}$ cyclic alkyl, and substituted or unsubstituted phenyl.

Examples of suitable substituted or unsubstituted $C_1$-$C_{10}$ linear or branched alkyl for $R^{10}$-$R^{13}$ include, but are not limited to, methyl, ethyl, propyl, butyl, pentyl, hexyl, octyl, iso-propyl, iso-butyl, t-butyl, 1,2,2-tetramethylpropyl, and decyl. Suitable substituents include, but are not limited to, halogen (e.g., Cl, Br, or F), $C_1$-$C_{10}$ linear or branched alkoxy, $C_1$-$C_{10}$ linear or branched fluoroalkoxy, $C_3$-$C_{10}$ cyclic alkoxy, and substituted or unsubstituted aryl.

Examples of biguanides having a substituted or unsubstituted aryl include, but are not limited to, 1-phenylbiguanide, 1-(o-tolyl)biguanide, 1-(3-methylphenyl)biguanide, 1-(4-methylphenyl)biguanide, 1-(2-chlorophenyl)biguanide, 1-(4-chlorophenyl)biguanide, 1-(2,3-dimethylphenyl)biguanide, 1-(2,6-dimethylphenyl)biguanide, 1-(1-naphthyl)biguanide, 1-(4-methoxyphenyl)biguanide, 1-(4-nitrophenyl)biguanide, 1,1-diphenylbiguanide, 1,5-diphenylbiguanide, 1,5-bis(4-chlorophenyl)biguanide, 1,5-bis(3-chlorophenyl)biguanide, 1-(4-chloro)phenyl-5-(4-methoxy)phenylbiguanide, 1,1-bis(3-chloro-4-methoxyphenyl)biguanide, 1,5-bis(3,4-dichlorophenyl)biguanide, 1,5-bis(3,5-dichlorophenyl)biguanide, 1,5-bis(4-bromophenyl)biguanide.

Examples of biguanides having a substituted or unsubstituted aryl group and a substituted or unsubstituted $C_1$-$C_{10}$ linear or branched alkyl group include, but are not limited to, 1-phenyl-1-methylbiguanide, 1-(4-chlorophenyl)-5-(1-methylethyl)biguanide (Proguanil), 1-(3,4-dichlorophenyl)-5-(1-methylethyl)biguanide, 1-(4-methylphenyl)-5-octylbiguanide, 1-(4-chlorophenyl)-2-(N'-propan-2-ylcarbamimidoyl) guanidine, ditolylbiguanide, dinaphthylbiguanide, and dibenzylbiguanide.

Examples of biguanides having a substituted or substituted $C_1$-$C_{10}$ linear or branched alkyl include, but are not limited to, 4-chlorobenzhydryl biguanide, 1-benzo[1,3]dioxol-5-ylmethylbiguanide, 1-benzyl-5-(pyridine-3-yl) methylbiguanide, 1-benzylbiguanide, 4-chlorobenzylbiguanide, 1-(2-phenylethyl)biguanide, 1-hexyl-5-benzyl biguanide, 1,1-dibenzylbiguanide, 1,5-dibenzylbiguanide, 1-(phenethyl)-5-propylbiguanide, and 1,5-bis(phenethyl) biguanide.

Examples of biguanides having a substituted or unsubstituted $C_3$-$C_{10}$ cyclic alkyl include, but are not limited to, 1-cyclohexyl-5-phenylbiguanide, 1-(4-phenylcyclohexyl) biguanide, 1-(4-methyl)cyclohexyl-5-phenylbiguanide, and 1-cyclopentyl-5-(4-methoxyphenyl)biguanide, norbornylbiguanide, dinorbornylbiguanide, adamantylbiguanide, diadamantylbiguanide, dicyclohexylbiguanide.

Examples of Structure (II) where $R^{14}$ is a single bond that together with $R^{13}$ forms an imidazole ring, include but are not limited to, 2-guanidinobenzimidazole, 5-methyl-2-guanidinobenzim idazole, 4,6-dimethyl-2-guanidinobenzimidazole, 5,6-dimethyl-2-guanidinobenzim idazole, 5-chloro-2-guanidinobenzimidazole, 4,5-dichloro-2-guanidinobenzimidazole, 4,6-dichloro-2-guanidinobenzimidazole, 5-bromo-2-guanidinobenzimidazole, 5-phenyl-2-guanidinobenzimidazole, and 5-methoxy-2-guanidinobenzim idazole.

In some embodiments, the second chelating agent contains multiple biguanide groups. In some embodiments, the second chelating agent contains two biguanide groups. These second chelating agents are referred to herein as bisbiguanides or dibiguanides. In some embodiments, the second chelating agent containing multiple biguanide groups is a polymeric biguanide. Polymeric biguanides contemplated include polymers wherein the biguanide moiety is contained within the backbone of the polymer, as well as polymers containing pendant biguanide moieties.

An example of the second chelating agent containing two biguanide groups is a compound of Structure (III):

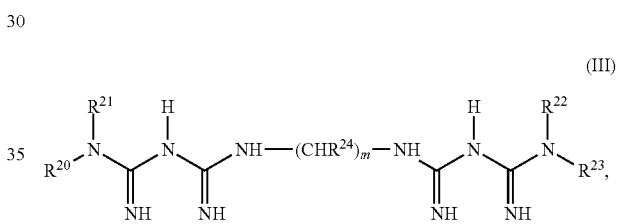

in which $R^{20}$, $R^{21}$, $R^{22}$, and $R^{23}$ are independently selected from the group consisting of hydrogen, substituted or unsubstituted aryl, substituted or unsubstituted $C_3$-$C_{10}$ cyclic alkyl, and substituted or unsubstituted $C_1$-$C_{10}$ linear or branched alkyl; each $R^{24}$ is independently selected from the group consisting of hydrogen, substituted or unsubstituted aryl, substituted or unsubstituted phenylethyl, or substituted or unsubstituted benzyl alkyl; and m is an integer from 1 to 10; provided that at least one of $R^{20}$, $R^{21}$, $R^{22}$, $R^{23}$ and $R^{24}$ is an aryl group or contains an aryl substituent and that at least two of $R_{20}$, $R_{21}$, $R_{22}$, and $R^{23}$ are hydrogen.

Examples of bisbiguanides of Structure (III) include, but are not limited to, ethylenedibiguanide, propylenedibiguanide, tetramethylenedibiguanide, pentamethylenedibiguanide, hexamethylenedibiguanide, heptamethylenedibiguanide, octamethylenedibiguanide, 1,6-bis-(4-chlorobenzylbiguanido)-hexane (Fluorhexidine(R)), 1,1'-hexamethylene bis(5-(p-chlorophenyl)biguanide) (chlorhexidine), 2-(benzyloxymethyl)pentane-1,5-bis(5-hexylbiguanide), 2-(phenylthiomethyl)pentane-1,5-bis(5-phenethylbiguanide), 3-(phenylthio)hexane-1,6-bis(5-hexylbiguanide), 3-(phenylthio)hexane-1,6-bis(5-cyclohexylbiguanide), 3-(benzylthio)hexane-1,6-bis(5-hexylbiguanide), and 3-(benzylthio)hexane-1,6-bis(5-cyclohexylbiguanide).

In one embodiment, the second chelating agent is a bisbiguanide having the following structure:

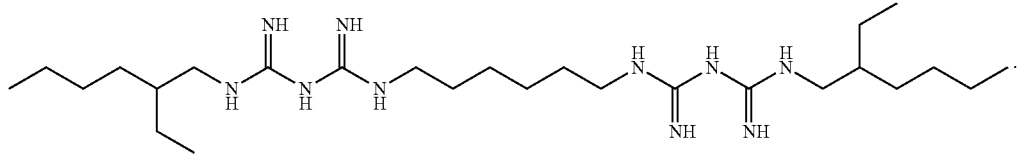 [SMILES: CCCCC(CC)CNC(=N)NC(=N)NCCCCCCNC(=N)NC(=N)NCC(CC)CCCC]

This bisbiguanide is also known as alexidine.

In some embodiments, the second chelating agent containing two biguanide groups include, but are not limited to, phenylenyldibiguanide, naphthylenyldibiguanide, pyridinyldibiguanide, piperazinyldibiguanide, phthalyldibiguanide, 1,1'[4-(dodecyloxy)-m-phenylene]bisbiguanide, 2-(decylthiomethyl)pentane-1,5-bis(5-isopropylbiguanide), and 2-(decylthiomethyl)pentane-1,5-bis(5,5-diethylbiguanide).

In some embodiments, the second chelating agent containing multiple biguanide groups is a polymeric biguanide. Exemplary polymeric biguanides contemplated as a component of the compositions described herein have the Structure (IV):

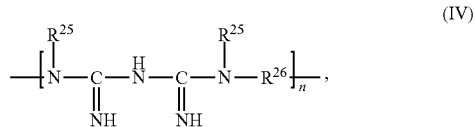

(IV)

in which n is an integer of at least 2; each $R^{25}$, independently, is H or $C_1$-$C_6$ alkyl; and each $R^{26}$, independently is optionally substituted C1-C20 alkylene (e.g., $C_4$-$C_{10}$ alkylene).

As used herein, "alkylene" refers to a divalent organic radical. Examples of divalent alkylene moieties include, but are not limited to, —$CH_2$—, —$CH_2CH_2$—, —$CH_2CH_2CH_2$—, —$CH_2CH_2CH_2CH_2$—, —$CH_2CH_2CH_2CH_2CH_2$—, —$CH_2CH_2CH_2CH_2CH_2CH_2$—, and the like. In some embodiments, $R^{26}$ is —$CH_2CH_2CH_2CH_2CH_2CH_2$—.

In some embodiments, the $C_1$-$C_{20}$ alkylene is optionally substituted. Suitable substituents include, but are not limited to, $C_1$-$C_{10}$ linear or branched alkyl, $C_3$-$C_{10}$ cyclic alkyl, substituted or unsubstituted phenyl, $C_1$-$C_{10}$ linear or branched alkoxy, $C_3$-$C_{10}$ cyclic alkoxy, nitro, hydroxyl, SH, halogen, amino, dioxolyl, biguanidyl, cyano, carboxyl, ester, amide, ether, sulfide, disulfide, sulfoxide, and sulfone.

In some embodiments, at least one methylene unit of the alkylene moieties described herein is replaced by a heteroatom, such as, —O—, —NH—, —S—, and the like.

In some embodiments, n is an integer from 2 to 6000. In some embodiments, n is an integer from 3 to 3000. In some embodiments, n is an integer from 3 to 1000. In some embodiments, n is an integer from 5 to 300. In some embodiments, n is an integer from 5 to 50. In some embodiments, n is an integer from 10 to 20 (e.g., 12 or 15).

In some embodiments, the polymeric biguanides contemplated as components in the compositions described herein have the above structure wherein $R^{25}$ is H, $R^{26}$ is $C^6$ alkylene, and n is 12 or 15.

In addition to the polymeric biguanides set forth above, polymeric biguanides bearing pendant biguanide moieties are contemplated. Examples of these embodiments include, but are not limited to, polymerization products of biguanidyl-substituted α-olefin monomers, such as poly(vinylbiguanide), poly(N-vinylbiguanide), poly(allylbiguanide), and co-polymers thereof. It is understood that the biguanidyl-substituted α-olefin monomers can be co-polymerized with a variety of olefinic monomers, such that the number of pendant biguanidyl moieties per polymer chain can be varied widely.

The biguanides disclosed herein readily form salts with a variety of acids, both organic and inorganic. Inorganic acid salts of the biguanides contemplated for use in the compositions described herein include, but are not limited to, hydrochloric, hydrofluoric, hydrobromic, hydroiodic, phosphoric, phosphoric, sulfonic, sulfuric, and the like. Organic acid salts of the biguanides contemplated for use in the compositions described herein include, but are not limited to, optionally substituted carboxylic acids such as valeric, hexanoic, octanoic, 2-octenoic, lauric, 5-dodecenoic, myristic, pentadecanoic, palmitic, oleic, stearic, eicosanoic, heptadecanoic, palmitoleic, ricinoleic, 12-hydroxystearic, 16-hydroxyhexadecanoic, 2-hydroxycaproic, 12-hydroxydodecanoic, 5-hydroxydodecanoic, 5-hydroxydecanoic, 4-hydroxydecanoic, dodecanedioic, undecanedioic, sebacic, benzoic, hydroxbenzoic, teraphthalic, and the like.

Examples of other suitable second chelating agents include alkylenediamines such as ethylenediamine, propylenediamine, butylenediamine, hexylenediamine, diethylenetriamine, triethylenetetramines, and polyethyleneimine having at least 2 nitrogen containing groups.

In some embodiments, the compositions of this disclosure include at least about 0.01% by weight (e.g., at least about 0.1% by weight, at least about 0.2% by weight, at least about 0.3% by weight, or at least about 0.4% by weight) and/or at most about 1.8% by weight (e.g., at most about 1.5% by weight, at most about 1.3% by weight, at most about 1.1% by weight, at most about 1% by weight, at most about 0.8% by weight, at most about 0.7% by weight, at most about 0.6% by weight, or at most about 0.5% by weight) of the second chelating agent.

The compositions of this disclosure contain at least one metal corrosion inhibitor selected from substituted or unsubstituted benzotriazoles. Suitable classes of substituted benzotriazole include, but are not limited to, benzotriazoles substituted with alkyl groups, aryl groups, halogen groups, amino groups, nitro groups, alkoxy groups, and hydroxyl groups. Substituted benzotriazoles also include those fused with one or more aryl (e.g., phenyl) or heteroaryl groups. For the purposes of this disclosure, the phrase "substituted or unsubstituted benzotriazoles" is defined to exclude any benzotriazole compound simultaneously containing both a carboxyl group and a primary or secondary amino group.

Suitable benzotriazoles for use as a metal corrosion inhibitor include, but are not limited to, benzotriazole (BTA), 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-aminobenzotriazole, 5-methyl-1H-benzotriazole (or 5-methylbenzotriazole), benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1', 1'-dimethylpropyl)-benzotriazole, 5-(1', 1', 3'-trimethylbutyl)benzotriazole, 5-n-octyl benzotriazole, and 5-(1', 1', 3', 3'-tetramethylbutyl)benzotriazole.

In some embodiments, the compositions of this disclosure include at least about 0.05% by weight (e.g., at least about 0.1% by weight, at least about 0.2% by weight, or at least about 0.3% by weight) and/or at most about 1% by weight (e.g., at most about 0.7% by weight, at most about 0.6% by weight, or at most about 0.5% by weight) of the metal corrosion inhibitor.

The compositions of this disclosure contain at least one organic solvent selected from the group of water soluble alcohols, water soluble ketones, water soluble esters, and water soluble ethers (e.g., glycol diethers).

Classes of water soluble alcohols include, but are not limited to, alkane diols (including, but not limited to, alkylene glycols), glycols, alkoxyalcohols (including but not limited to glycol monoethers), saturated aliphatic monohydric alcohols, unsaturated non-aromatic monohydric alcohols, and low molecular weight alcohols containing a ring structure.

Examples of water soluble alkane diols includes, but are not limited to, 2-methyl-1,3-propanediol, 1,3-propanediol, 2,2-dimethyl-1,3-propanediol, 1,4-butanediol, 1,3-butanediol, 1,2-butanediol, 2,3-butanediol, pinacol, and alkylene glycols.

Examples of water soluble alkylene glycols include, but are not limited to, ethylene glycol, propylene glycol, diethylene glycol, dipropylene glycol, triethylene glycol and tetraethyleneglycol.

Examples of water soluble alkoxyalcohols include, but are not limited to, 3-methoxy-3-methyl-1-butanol, 3-methoxy-1-butanol, 1-methoxy-2-butanol, and water soluble glycol monoethers.

Examples of water soluble glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monomethyl ether, tripropylene glycol monomethyl ether and ethylene glycol monobenzyl ether, diethylene glycol monobenzyl ether.

Examples of water soluble saturated aliphatic monohydric alcohols include, but are not limited to, methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of water soluble unsaturated non-aromatic monohydric alcohols include, but are not limited to, allyl alcohol, propargyl alcohol, 2-butenyl alcohol, 3-butenyl alcohol, and 4-penten-2-ol.

Examples of water soluble, low molecular weight alcohols containing a ring structure include, but are not limited, to tetrahydrofurfuryl alcohol, furfuryl alcohol, and 1,3-cyclopentanediol.

Examples of water soluble ketones include, but are not limited to, acetone, propanone, cyclobutanone, cyclopentanone, cyclohexanone, diacetone alcohol, 2-butanone, 5-hexanedione, 1,4-cyclohexanedione, 3-hydroxyacetophenone, 1,3-cyclohexanedione, and cyclohexanone.

Examples of water soluble esters include, but are not limited to, ethyl acetate, glycol monoesters such as ethylene glycol monoacetate, diethyleneglycol monoacetate, and glycol monoether monoesters such as propylene glycol monomethyl ether acetate, ethylene glycol monomethyl ether acetate, propylene glycol monoethyl ether acetate, and ethylene glycol monoethyl ether acetate.

In some embodiments, the compositions of this disclosure include at least about 1% by weight (e.g., at least about 5% by weight, at least about 8% by weight, or at least about 10% by weight) and/or at most about 30% by weight (e.g., at most about 25% by weight, at most about 20% by weight, or at most about 15% by weight) of the organic solvent.

The cleaning compositions of the present disclosure further include water. Preferably, the water is de-ionized and ultra-pure, contains no organic contaminants and has a minimum resistivity of about 4 to about 17 mega Ohms. More preferably, the resistivity of the water is at least 17 mega Ohms.

In some embodiments, the compositions of this disclosure include at least about 78% by weight (e.g., at least about 80% by weight, at least about 83% by weight, or at least about 85% by weight) and/or at most about 98% by weight (e.g., at most about 95% by weight, at most about 93% by weight, or at most about 90% by weight) of water.

The compositions of this disclosure optionally contains at least one pH adjusting agent to control the pH to between about 6 to about 11. In some embodiments, the compositions of this disclosure can have a pH of at least about 6 (e.g., at least about 6.5, at least about 7, or at least about 7.5) to at most about 11 (e.g., at most about 10, at most about 9.5, at most about 9, at most about 8.5). Without wishing to be bound by theory, it is believed that a cleaning composition having a pH higher than 11 decreases the plasma etch residue cleaning to an impractical level for complete cleaning and that a pH lower than 6 would increase the etch rate of W to an undesirable level. The effective pH can vary depending on the types and amounts of the ingredients used in the compositions described herein.

The amount of pH adjusting agent required, if any, can vary as the concentration of the other components is varied in different formulations, particularly the hydroxylamine, the first chelating agent polyaminopolycarboxylic acid, and the second chelating agent (or its neutralized salt), and as a function of the molecular weight of the particular pH adjusting agent employed. In general, the pH adjusting agent concentration ranges from about 0.1% to about 3%. In some embodiments, the cleaning compositions of this disclosure include at least about 0.1% by weight (e.g., at least about 0.5% by weight, at least about 1% by weight, or at least about 1.5% by weight) and/or at most about 3% by weight (e.g., at most about 2.5% by weight, at most about 2% by weight, or at most about 1.5% by weight) of the pH adjusting agent.

In general, the pH adjusting agent is free of any metal ion (except for a trace amount of metal ion impurities). Suitable metal ion free pH adjusting agents include ammonium hydroxide, quaternary ammonium hydroxides, monoamines (including alkanolamines), imines (such as 1,8-diazabicyclo[5.4.0]-7-undecene and 1,5-diazabicyclo[4.3.0]-5-nonene), and guanidine salts (such as guanidine carbonate).

Examples of suitable quaternary ammonium hydroxides, include, but are not limited to, tetramethyl ammonium hydroxide, tetraethyl ammonium hydroxide, tetrapropyl ammonium hydroxide, tetrabutyl ammonium hydroxide, dimethyldiethylammonium hydroxide, choline, tetraethanolammonium hydroxide, benzyltrimethylammonium hydroxide, benzyltriethylammonium hydroxide, and benzyltributylammonium hydroxide.

Examples of suitable monoamines include, but are not limited to, triethylamine, tributylamine, tripentylamine, ethanolamine, diethanolamine, diethylamine, butylamine, dibutylamine, and benzylamine.

In some embodiments, the non-corrosive cleaning composition of this disclosure contains, consists, or consists essentially of at least about 0.5% by weight (e.g., at least about 1% by weight, at least about 2% by weight, at least about 3% by weight, or at least about 5% by weight) and/or at most about 20% by weight (e.g., at most about 17% by weight, at most about 15% by weight, at most about 12% by weight, or at most about 10% by weight) of the redox agent; at least about 0.01% by weight (e.g., at least about 0.1% by weight, at least about 0.2% by weight or at least about 0.3% by weight) and/or at most about 1% by weight (e.g., at most about 0.7% by weight, at most about 0.6% by weight or at most about 0.5% by weight) of the first chelating agent (i.e., a polyaminopolycarboxylic acid); at least about 0.01% by weight (e.g., at least about 0.1% by weight, at least about 0.2% by weight, at least about 0.3% by weight, or at least about 0.4% by weight) and/or at most about 1.8% by weight (e.g., at most about 1.5% by weight, at most about 1.3% by weight, at most about 1.1% by weight, at most about 1% by weight, at most about 0.8% by weight, at most about 0.7% by weight, at most about 0.6% by weight, or at most about 0.5% by weight) of the second chelating agent; at least about 0.05% by weight (e.g., at least about 0.1% by weight, at least about 0.2% by weight, or at least about 0.3% by weight) and/or at most about 1% by weight (e.g., at most about 0.7% by weight, at most about 0.6% by weight, or at most about 0.5% by weight) of the metal corrosion inhibitor selected from the group consisting of substituted and unsubstituted benzotriazoles; at least about 1% by weight (e.g., at least about 5% by weight, at least about 8% by weight, or at least about 10% by weight) and/or at most about 30% by weight (e.g., at most about 25% by weight, at most about 20% by weight, or at most about 15% by weight) of the organic solvent; at least about 78% by weight (e.g., at least about 80% by weight, at least about 83% by weight, or at least about 85% by weight) and/or at most about 98% by weight (e.g., at most about 95% by weight, at most about 93% by weight, or at most about 90% by weight) of water; and optionally, about 0.1% to about 3% of a metal ion free pH adjusting agent; wherein the pH of the non-corrosive cleaning composition is from at least 6 (e.g., at least about 6.5, at least about 7, or at least about 7.5) to at most about 11 (e.g., at most about 10, at most about 9.5, at most about 9, at most about 8.5).

In some embodiments, the non-corrosive cleaning composition of this disclosure contains, consists, or consists essentially of at least about 0.5% by weight (e.g., at least about 1% by weight, at least about 2% by weight, at least about 3% by weight, or at least about 5% by weight) and/or at most about 20% by weight (e.g., at most about 17% by weight, at most about 15% by weight, at most about 12% by weight, or at most about 10% by weight) of hydroxylamine; at least about 0.01% by weight (e.g., at least about 0.1% by weight, at least about 0.2% by weight or at least about 0.3% by weight) and/or at most about 1% by weight (e.g., at most about 0.7% by weight, at most about 0.6% by weight or at most about 0.5% by weight) of the first chelating agent (i.e., a polyaminopolycarboxylic acid); at least about 0.01% by weight (e.g., at least about 0.1% by weight, at least about 0.2% by weight, at least about 0.3% by weight, or at least about 0.4% by weight) and/or at most about 1.8% by weight (e.g., at most about 1.5% by weight, at most about 1.3% by weight, at most about 1.1% by weight, at most about 1% by weight, at most about 0.8% by weight, at most about 0.7% by weight, at most about 0.6% by weight, or at most about 0.5% by weight) of the second chelating agent selected from the group containing of compounds having at least two nitrogen containing groups selected from the group consisting of primary amino, secondary amino, imidazolyl, triazolyl, benzotriazolyl, piperazinyl, pyrolyl, pyrrolidinyl, pyrazolyl, piperidinyl, guanidinyl, biguanidinyl, carbazatyl, hydrazidyl, sem icarbazidyl, and am inoguanidinyl; at least about 0.05% by weight (e.g., at least about 0.1% by weight, at least about 0.2% by weight, or at least about 0.3% by weight) and/or at most about 1% by weight (e.g., at most about 0.7% by weight, at most about 0.6% by weight, or at most about 0.5% by weight) of the metal corrosion inhibitor selected from the group consisting of substituted and unsubstituted benzotriazoles; at least about 1% by weight (e.g., at least about 5% by weight, at least about 8% by weight, or at least about 10% by weight) and/or at most about 30% by weight (e.g., at most about 25% by weight, at most about 20% by weight, or at most about 15% by weight) of the organic solvent selected from the group consisting of water soluble alcohols, water soluble ketones, water soluble esters, and water soluble ethers; at least about 78% by weight (e.g., at least about 80% by weight, at least about 83% by weight, or at least about 85% by weight) and/or at most about 98% by weight (e.g., at most about 95% by weight, at most about 93% by weight, or at most about 90% by weight) of water; and optionally, about 0.1% to about 3% of a metal ion free pH adjusting agent; wherein the pH of the non-corrosive cleaning composition is from at least 6 (e.g., at least about 6.5, at least about 7, or at least about 7.5) to at most about 11 (e.g., at most about 10, at most about 9.5, at most about 9, at most about 8.5).

In some embodiments, the non-corrosive cleaning composition of this disclosure contains, consists, or consists essentially of at least about 0.5% by weight (e.g., at least about 1% by weight, at least about 2% by weight, at least about 3% by weight, or at least about 5% by weight) and/or at most about 20% by weight (e.g., at most about 17% by weight, at most about 15% by weight, at most about 12% by weight, or at most about 10% by weight) of hydroxylamine; at least about 0.01% by weight (e.g., at least about 0.1% by weight, at least about 0.2% by weight or at least about 0.3% by weight) and/or at most about 1% by weight (e.g., at most about 0.7% by weight, at most about 0.6% by weight or at most about 0.5% by weight) of the first chelating agent (i.e., a polyaminopolycarboxylic acid); at least about 0.01% by weight (e.g., at least about 0.1% by weight, at least about 0.2% by weight, at least about 0.3% by weight, or at least about 0.4% by weight) and/or at most about 1.8% by weight (e.g., at most about 1.5% by weight, at most about 1.3% by weight, at most about 1.1% by weight, at most about 1% by weight, at most about 0.8% by weight, at most about 0.7% by weight, at most about 0.6% by weight, or at most about 0.5% by weight) of the second chelating agent selected from the group consisting of a monocarboxylic acid compound containing a primary or secondary amino group and at least one additional nitrogen-containing basic group, a biguanide compound having Structure II, and a compound having multiple biguanide groups; at least about 0.05% by weight (e.g., at least about 0.1% by weight, at least about 0.2% by weight, or at least about 0.3% by weight) and/or at most about 1% by weight (e.g., at most about 0.7% by weight, at most about 0.6% by weight, or at most about 0.5% by weight) of the metal corrosion inhibitor selected from the group consisting of substituted and unsubstituted benzotriazoles; at least about 1% by weight (e.g., at least about 5% by weight, at least about 8% by weight, or at least about 10% by weight) and/or at most about 30% by weight (e.g., at most about 25% by weight, at most about 20% by weight, or at most about 15% by weight) of the organic solvent selected from the group consisting of water soluble alcohols, water soluble ketones, water soluble esters, and water soluble ethers; at least about 78% by weight (e.g., at least about 80% by weight, at least about 83% by weight, or at least about 85% by weight) and/or at most about 98% by weight (e.g., at most about 95% by weight, at most about 93% by weight, or at most about 90% by weight) of water; and optionally, about 0.1% to about 3% of a metal ion free pH adjusting agent; wherein the pH of the non-corrosive cleaning composition is from at least 6 (e.g., at least about 6.5, at least about 7, or at least about 7.5) to at most about 11 (e.g., at most about 10, at most about 9.5, at most about 9, at most about 8.5).

In addition, in some embodiments, the cleaning compositions of the present disclosure may contain additives such as, additional pH adjusting agents, additional corrosion inhibitors, surfactants, additional organic solvents, biocides, and defoaming agents as optional components.

Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference).

In some embodiments, the cleaning compositions of the present disclosure may specifically exclude one or more of the additive components, in any combination, if more than one. Such components are selected from the group consisting of oxygen scavengers, quaternary ammonium hydroxides, amines, alkali metal and alkaline earth bases (such as NaOH, KOH, LiOH, magnesium hydroxide, and calcium hydroxide), surfactants other than a defoamer, fluoride containing compounds, oxidizing agents (e.g., peroxides, hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, and peracetic acid), abrasives, silicates, hydroxycarboxylic acids, carboxylic and polycarboxylic acids lacking amino groups, non-azole corrosion inhibitors, guanidine, guanidine salts, inorganic acids (e.g., sulfonic acids, sulfuric acid, sulfurous acid, nitrous acid, nitric acid, phosphorous acid, and phosphoric acid), pyrrolidone, polyvinyl pyrrolidone, metal halides, metal halides of the formula $W_zMX_y$, wherein W is selected from H, an alkali or alkaline earth metal, and a metal-ion-free hydroxide base moiety; M is a metal selected from the group consisting of Si, Ge, Sn, Pt, P, B, Au, Ir, Os, Cr, Ti, Zr, Rh, Ru and Sb; y is from 4 to 6; and z is 1, 2, or 3, and corrosion inhibitors other than those described in this disclosure.

In general, the cleaning compositions of the present disclosure are not specifically designed to remove bulk photoresist films from semiconductor substrates. Rather, the cleaning compositions of the present disclosure are generally designed to remove all residues after bulk resist removal by dry or wet stripping methods. Therefore, the cleaning method of the present disclosure is preferably employed after a dry or wet photoresist stripping process. This photoresist stripping process is generally preceded by a pattern transfer process, such as an etch or implant process, or it is done to correct mask errors before pattern transfer. The chemical makeup of the residue will depend on the process or processes preceding the cleaning step.

Any suitable dry stripping process can be used to remove bulk resist from semiconductor substrates. Examples of suitable dry stripping processes include oxygen based plasma ashing, such as a fluorine/oxygen plasma or a $N_2/H_2$ plasma; ozone gas phase-treatment; fluorine plasma treatment, hot $H_2$ gas treatment (such as that described in U.S. Pat. No. 5,691,117 incorporated herein by reference in its entirety), and the like. In addition, any conventional organic wet stripping solution known to a person skilled in the art can be used to remove bulk resist from semiconductor substrates.

A preferred stripping process used in combination with the cleaning method of the present disclosure is a dry stripping process. Preferably, this dry stripping process is the oxygen based plasma ashing process. This process removes most of the photoresist from the semiconductor substrate by applying a reactive-oxygen atmosphere at elevated temperatures (typically 250° C.) at vacuum conditions (i.e., 1 torr). Organic materials are oxidized by this process and are removed with the process gas. However, this process does not remove inorganic or organometallic contamination from the semiconductor substrate. A subsequent cleaning of the semiconductor substrate with the cleaning composition of the present disclosure is typically necessary to remove those residues.

One embodiment of the present disclosure is a method of cleaning residues from a semiconductor substrate that includes contacting a semiconductor substrate containing post etch residues and/or post ash residues with a cleaning composition described herein. The method can further include rinsing the semiconductor substrate with a rinse solvent after the contacting step and/or drying the semiconductor substrate after the rinsing step.

In some embodiments, the cleaning method include the steps of:
(A) providing a semiconductor substrate containing post etch and/or post ash residues;
(B) contacting said semiconductor substrate with a cleaning composition described herein;
(C) rinsing said semiconductor substrate with a suitable rinse solvent; and (D) optionally, drying said semiconductor substrate by any means that removes the rinse solvent and does not compromise the integrity of said semiconductor substrate.

In some embodiments, the cleaning method further includes forming a semiconductor device (e.g., an integrated circuit device such as a semiconductor chip) from the semiconductor substrate obtained by the method described above.

The semiconductor substrates to be cleaned in this method can contain organic and organometallic residues, and additionally, a range of metal oxides that need to be removed. Semiconductor substrates typically are constructed of silicon, silicon germanium, Group III-V compounds like GaAs, or any combination thereof. The semiconductor substrates may additionally contain exposed integrated circuit structures such as interconnect features like metal lines and dielectric materials. Metals and metal alloys used for interconnect features include, but are not limited to, aluminum, aluminum alloyed with copper, copper, titanium, tantalum, cobalt, and silicon, titanium nitride, tantalum nitride, and tungsten. Said semiconductor substrate may also contain layers of interlayer dielectrics, silicon oxide, silicon nitride, silicon carbide, titanium oxide, and carbon doped silicon oxides.

The semiconductor substrate can be contacted with a cleaning composition by any suitable method, such as placing the cleaning composition into a tank and immersing and/or submerging the semiconductor substrates into the cleaning composition, spraying the cleaning composition onto the semiconductor substrate, streaming the cleaning composition onto the semiconductor substrate, or any combinations thereof. Preferably, the semiconductor substrates are immersed into the cleaning composition.

The cleaning compositions of the present disclosure may be effectively used up to a temperature of about 90° C. Preferably, the cleaning compositions can be used from about 25° C. to about 80° C. More preferably, the cleaning compositions can be employed in the temperature range from about 30° C. to about 60° C. and most preferred is a temperature range of about 40° C. to about 60° C.

Similarly, cleaning times can vary over a wide range depending on the particular cleaning method and temperature employed. When cleaning in an immersion batch type process, a suitable time range is, for example, up to about 60 minutes. A preferred range for a batch type process is from about 1 minute to about 60 minutes. A more preferred time range for a batch type process is from about 3 minutes to about 20 minutes. A most preferred time range for a batch type cleaning process is from about 4 minutes to about 15 minutes.

Cleaning times for a single wafer process may range from about 10 seconds to about 5 minutes. A preferred cleaning time for a single wafer process may range from about 15 seconds to about 4 minutes. A more preferred cleaning time for a single wafer process may range from about 15 seconds to about 3 minutes. A most preferred cleaning time for a single wafer process may range from about 20 seconds to about 2 minutes.

To further promote the cleaning ability of the cleaning composition of the present disclosure, mechanical agitation means may be employed. Examples of suitable agitation means include circulation of the cleaning composition over the substrate, streaming or spraying the cleaning composition over the substrate, and ultrasonic or megasonic agitation during the cleaning process. The orientation of the semiconductor substrate relative to the ground may be at any angle. Horizontal or vertical orientations are preferred.

The cleaning compositions of the present disclosure can be used in conventional cleaning tools known to those skilled in the art. A significant advantage of the compositions of the present disclosure is that they include relatively non-toxic, non-corrosive, and non-reactive components in whole and in part, whereby the compositions are stable in a wide range of temperatures and process times. The compositions of the present disclosure are chemically compatible with practically all materials used to construct existing and proposed semiconductor wafer cleaning process tools for batch and single wafer cleaning.

Subsequent to the cleaning, the semiconductor substrate is rinsed with a suitable rinse solvent for about 5 seconds up to about 5 minutes with or without agitation means. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Alternatively, aqueous rinses with pH>8 (such as dilute aqueous ammonium hydroxide) may be employed. Preferred examples of rinse solvents include, but are not limited to, dilute aqueous ammonium hydroxide, DI water, methanol, ethanol and isopropyl alcohol. More preferred rinse solvents are dilute aqueous ammonium hydroxide, DI water and isopropyl alcohol. The most preferred rinse solvents are dilute aqueous ammonium hydroxide and DI water. The solvent may be applied using means similar to that used in applying a cleaning composition described herein. The cleaning composition may have been removed from the semiconductor substrate prior to the start of the rinsing step or it may still be in contact with the semiconductor substrate at the start of the rinsing step. Preferably, the temperature employed in the rinsing step is between 16° C. and 27° C.

Optionally, the semiconductor substrate is dried after the rinsing step. Any suitable drying means known in the art may be employed. Examples of suitable drying means include spin drying, flowing a dry gas across the semiconductor substrate, or heating the semiconductor substrate with a heating means such as a hotplate or infrared lamp, Marangoni drying, rotagoni drying, IPA drying or any combinations thereof. Drying times will be dependent on the specific method employed but are typically on the order of 30 seconds up to several minutes.

In some embodiments, a method of manufacturing an integrated device using a cleaning composition described herein can include the following steps. First, a layer of a photoresist is applied to a semiconductor substrate. The semiconductor substrate thus obtained can then undergo a pattern transfer process, such as an etch or implant process, to form an integrated circuit. The bulk of the photoresist can then be removed by a dry or wet stripping method (e.g., an oxygen based plasma ashing process). Remaining residues on the semiconductor substrate can then be removed using a cleaning composition described herein in the manner described above. The semiconductor substrate can subsequently be processed to form one or more additional circuits on the substrate or can be processed to form into a semiconductor chip by, for example, assembling (e.g., dicing and bonding) and packaging (e.g., chip sealing).

EXAMPLES

The present disclosure is illustrated in more detail with reference to the following examples, which are for illustrative purposes and should not be construed as limiting the scope of the present disclosure. Any percentages listed are by weight (wt %) unless otherwise specified. Controlled stirring during testing was done with a 1 inch stirring bar at 300 rpm unless otherwise noted.

GENERAL PROCEDURE 1

Formulation Blending

Samples of cleaning compositions were prepared by adding, while stirring, to the calculated amount of ultra-pure deionized water (DIW) the components of the cleaning formulation except for the metal ion free pH adjuster. After a uniform solution was achieved, the optional additives, if used, were added. Formulation of the composition was completed by the addition of the pH adjuster. The solution was allowed to equilibrate and the pH of the cleaning composition was taken, if desired.

The pH measurements, if desired, were taken at ambient temperature (17-25° C.) after all components were fully dissolved. Beckman Coulter ϕ400 Series Handheld meters can be used for these pH measurements. All components used were commercially available and of high purity.

GENERAL PROCEDURE 2

Cleaning Evaluation with Beaker Test

The cleaning of PER (Post Etch Residue) from a substrate was carried out with the described cleaning compositions using a multilayered substrate of Photoresist/TiOx/SiN/Co/ILD (ILD=Inter Layer Dielectric) or photoresist/TiOx/SiN/W/ILD that had been patterned lithographically, etched in a plasma metal etcher, and followed by oxygen plasma ashing to remove the top layer of photoresist completely.

The test coupons were held using 4" long plastic locking tweezers, whereby the coupon could then be suspended into a 500 ml volume glass beaker containing approximately 200 milliliters of the cleaning compositions of the present disclosure. Prior to immersion of the coupon into the cleaning composition, the composition was pre-heated to the desired test condition temperature (typically 40° C. or 60° C. as noted) with controlled stirring. The cleaning tests were then carried out by placing the coupon which was held by the plastic tweezers into the heated composition in such a way that the PER layer containing side of the coupon faced the stir bar. The coupon was left static in the cleaning composition for a time period (typically 2 to 5 minutes) while the composition was kept at the test temperature under controlled stirring. When the desired cleaning time was completed, the coupon was quickly removed from the cleaning composition and placed in a 500 ml plastic beaker filled with approximately 400 ml of DI water at ambient temperature (~17° C.) with gentle stirring. The coupon was left in the beaker of DI water for approximately 30 seconds, and then quickly removed, and rinsed under a DI water stream at ambient temperature for about 30 seconds. The coupon was immediately exposed to a nitrogen gas stream from a hand held nitrogen blowing gun, which caused any droplets on the coupon surface to be blown off the coupon, and further, to completely dry the coupon device surface. Following this final nitrogen drying step, the coupon was removed from the plastic tweezers holder and placed into a covered plastic carrier with the device side up for short term storage no greater than about 2 hours. The scanning electron microscopy (SEM) images were then collected for key features on the cleaned test coupon device surface.

GENERAL PROCEDURE 3

Materials Compatibility Evaluation with Beaker test

The blanket Co on silicon substrate, W on silicon substrate, TiOx on $SiO_2$ on silicon substrate, SiN on silicon substrate, ILD on silicon substrate were diced into approximately 1 inch×1 inch square test coupons for the materials compatibility tests. The test coupons were initially measured for thickness or sheet resistance by the 4-point probe, CDE Resmap 273 for metallic film (Co, W), or by Elipsometry for dielectric film (TiOx, SiN and ILD) using a Woollam M-2000X. The test coupons were then installed on the 4" long plastic locking tweezers and treated as described in the cleaning procedure in General Procedure 2 with the Co, W, TiOx, SiN, or ILD layer containing side of the coupon faced the stir bar for 10 minutes.

After the final nitrogen drying step, the coupon was removed from the plastic tweezers holder and placed into a covered plastic carrier. The post-thickness or sheet resistance was then collected on the post-processing test coupon surface by the 4-point probe, CDE Resmap 273 for metallic film (Co and W) or by Elipsometry for dielectric film (TiOx, SiN and ILD) using a Woollam M-2000X.

Formulation Examples FE-1-FE-5 and Comparative Formulation Examples CFE-1-CFE-4

Table 1 contains formulations FE-1-FE-5 and comparative formulations CFE-1-CFE-4 prepared by General Procedure 1.

TABLE 1

| Ex. | $H_2O_2$ | Hydroxylamine | Polyaminopolycarboxylic acid | Second Chelant | Corr. Inhib. | Org. Solvent | Water | pH adjuster | pH |
|---|---|---|---|---|---|---|---|---|---|
| FE-1 | none | 4.00% | DTPA (0.5%) | CDC (0.001%) | 5MBTA (0.25%) | EGBE (5%) | 90.25% | none | 6.83 |
| FE-2 | none | 4.00% | DTPA (0.5%) | CDC (0.001%) | 5MBTA (0.25%) | EGBE (5%) | 89.75% | DBU (0.5%) | 7.47 |
| FE-3 | none | 4.00% | DTPA (0.5%) | CDC (0.001%) | 5MBTA (0.25%) | EGBE (5%) | 89.32% | DBU (0.93%) | 8.49 |
| FE-4 | none | 4.00% | DTPA (0.5%) | CDC (0.001%) | 5MBTA (0.25%) | EGBE (5%) | 88.96% | DBU (1.04%) | 9.01 |
| CFE-1 | none | 4.00% | DTPA (0.5%) | CDC (0.001%) | 5MBTA (0.25%) | EGBE (5%) | 89.11% | DBU (1.14%) | 9.6 |
| CFE-2 | none | 4.00% | DTPA (0.5%) | CDC (0.001%) | 5MBTA (0.25%) | EGBE (5%) | 88.97% | DBU (1.28%) | 10.2 |
| FE-5 | none | 4.00% | DTPA (0.5%) | Arginine (0.25%) | 5MBTA (0.25%) | EGBE (5%) | 89.16% | DBU (0.85%) | 8.47 |

TABLE 1-continued

| Ex. | H$_2$O$_2$ | Hydroxyl-amine | Polyamino-polycarboxylic acid | Second Chelant | Corr. Inhib. | Org. Solvent | Water | pH adjuster | pH |
|---|---|---|---|---|---|---|---|---|---|
| CFE-3 | none | 4.00% | DTPA (0.5%) | none | 5MBTA (0.25%) | EGBE (5%) | 89.29% | DBU (0.97%) | 8.53 |
| CFE-4 | 5% | none | DTPA (0.25%) | none | 5MBTA (0.22%) | EGBE (10%) | 83.98% | DBU (0.55%) | 7.9 |

EGBE = ethylene glycol butyl ether;
DTPA = diethylenetriamine pentaacetic acid;
5MBTA = 5-methyl-1H-benzotriazole;
DBU = .1,8-diazabicyclo[5.4.0]undec-7-ene;
CDC = chlorhexidine dihydrochloride
Arginine =

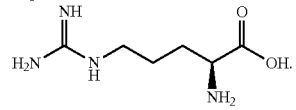

EXAMPLES 1-5 AND COMPARATIVE EXAMPLES CE1-CE4 COMPATABILITY OF CLEANERS WITH EXPOSED METALS

Formulation Examples FE-1-FE-5 and Comparative Formulation Examples CFE-1-CFE-4 were tested for cleaning according to General Procedure 2 and for materials compatibility according to General Procedure 3 at 65° C. for 4 minutes. The etch rates (Angstroms/minute) of Co, W, TiOx, SiN, SiC, TEOS (tetraethyl-orthosilicate), and ILD in the cleaning compositions are shown in Table 2.

TABLE 2

| Example | Formulation Example | TiOx | W | Co | ILD | SiN | SiC | TEOS | Clean (4 min.) |
|---|---|---|---|---|---|---|---|---|---|
| 1 | FE-1 | 1.6 | 2.1 | 0.2 | NA | NA | NA | NA | clean |
| 2 | FE-2 | 1.9 | 1.2 | 0.1 | NA | NA | NA | NA | clean |
| 3 | FE-3 | 2.2 | 1.1 | 0.1 | 0.4 | 0.1 | 0.3 | 0.8 | clean |
| 4 | FE-4 | 1.9 | 1 | 0.2 | NA | NA | NA | NA | mostly clean |
| CE-1 | CFE-1 | 0.2 | 0.7 | 0.1 | NA | NA | NA | NA | not clean |
| CE-2 | CFE-2 | 0.1 | 0.4 | 0.1 | NA | NA | NA | NA | not clean |
| 5 | FE-5 | 2.4 | 4.3 | 0.1 | 0.4 | 0.3 | 0.3 | 0.7 | clean |
| CE-3 | CFE-3 | 2.7 | 5.2 | 0.1 | 0.5 | 0.1 | 0 | 0.7 | clean |
| CE-4 | CFE-4 | 3.6 | >200 | 0.2 | 0.2 | NA | NA | NA | clean |

"NA" refers to data not available.

The data in Table 2 show that formulations of this disclosure (i.e., FE-1-FE-5) cleaned the post etch residue without significantly etching the semiconductor materials (such as Co, W, TiOx, SiN, SiC, TEOS, and ILD) typically found in semiconductor devices. On the other hand, Comparative Formulations CFE-1 and CFE-2 that had a pH above 9.5 resulted in poor cleaning. In addition, comparative formulation CFE-3 that had no second chelating agent exhibited significant etching of tungsten in the tested semiconductor substrate. Similarly, comparative formulation CFE-4 that included hydrogen peroxide instead of hydroxylamine also exhibited significant etching of tungsten in the semiconductor substrate.

Formulation Examples FE-6-FE-13 and Comparative Formulation Examples CFE-5 and CFE-6

Table 3 details formulations FE-6-FE-13 and Comparative Formulations CFE-5 andCFE-6, which were prepared by General Procedure 1.

TABLE 3

| Formulation Example | Hydroxyl amine | Polyamino-polycarboxylic acid | Second Chelant | Corr. Inhib. | Organic Solvent | Water | pH adjuster | pH |
|---|---|---|---|---|---|---|---|---|
| CFE-5 | 5.5% HA | 0.50% DTPA | none | 0.25% 5MBTA | 5% EGBE | 87.86% | 0.89% DBU | 8.68 |
| FE-6 | 5.5% HA | 0.50% DTPA | 0.75% PBG | 0.25% 5MBTA | 5% EGBE | 87.84% | 0.16% DBU | 8.52 |

TABLE 3-continued

| Formulation Example | Hydroxyl amine | Polyamino-polycarboxylic acid | Second Chelant | Corr. Inhib. | Organic Solvent | Water | pH adjuster | pH |
|---|---|---|---|---|---|---|---|---|
| FE-7 | 5.5% HA | 0.50% DTPA | 1.08% PBG | 0.25% 5MBTA | 5% EGBE | 87.67% | None | 8.47 |
| FE-8 | 5.5% HA | 0.50% DTPA | 0.75% PBG | 0.25% 5MBTA | 5% EGBE | 86.75% | 1.25% DBU | 10.72 |
| FE-9 | 5.5% HA | 0.50% DTPA | 1.47% PFCI | 0.25% 5MBTA | 5% EGBE | 85.58% | 1.45% DBU | 8.60 |
| CFE-6 | 5.5% HA | 0.50% DTPA | 1.01% MTCI | 0.25% 5MBTA | 5% EGBE | 86.79% | 0.95% DBU | 8.55 |
| FE-10 | 6.25% HA | 0.50% DTPA | 0.95% TBG | 0.25% 5MBTA | 5% EGBE | 87.05% | None | 8.45 |
| FE-11 | 5.5% HA | 0.50% DTPA | 1.17% TBG | 0.25% 5MBTA | 5% EGBE | 87.58% | None | 8.54 |
| FE-12 | 5.5% HA | 0.50% DTPA | 1.30% TBG | 0.25% 5MBTA | 5% EGBE | 87.45% | None | 9.13 |
| FE-13 | 5.5% HA | 0.50% DTPA | 0.25% GBI | 0.25% 5MBTA | 5% EGBE | 87.64% | 0.86% DBU | 8.54 |

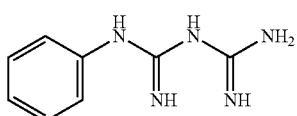

Phenylbiguanide (PBG)

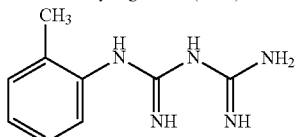

1-(o-Tolyl)biguanide (TBG)

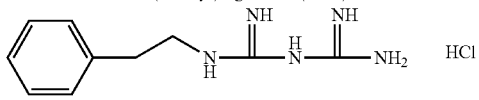

Phenformin hydrochloride (PFCl)

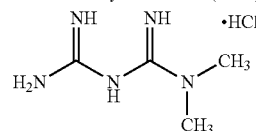

Metformin hydrochloride (MTCl)

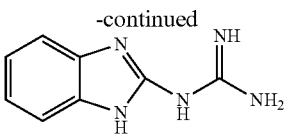

2-Guanidinobenzimidazole (GBI)

EXAMPLES 6-13 AND COMPARATIVE EXAMPLES CE-5 and CE-6 COMPATABILITY OF CLEANERS WITH EXPOSED METALS Formulation Examples FE-6-FE-13 and Comparative Formulation Examples CFE-5 andCFE-6 were tested for cleaning ability according to General Procedure 2 and for materials compatibility according to General Procedure 3 at 65° C. for 4 minutes. The etch rates (Angstroms/minute) of Co, W, TiOx, SiN, SiC, and ILD (where available) for the cleaning compositions are shown in Table 4.

All formulations in Table 4 showed excellent cleaning ability. However, Comparative Formulations CFE-5 (no biguanide) and CFE-6 (dialkyl biguanide) showed unacceptably high W etch rates. Formulation Examples FE-6-FE13 showed significantly decreased W etch rates, while maintaining acceptable etch rates on other materials and having excellent cleaning.

TABLE 4

| Example | Formulation Example | TiOx [A/min] | W [A/min] | Co [A/min] | SiN [A/min] | ILD [A/min] | Cleaning[1] |
|---|---|---|---|---|---|---|---|
| CE-5 | CFE-5 | 3.4 | 6.4 | NA | NA | NA | 5 |
| 6 | FE-6 | 2.9 | 1.6 | NA | NA | NA | 5 |
| 7 | FE-7 | 2.7 | 1.2 | 0.3 | 0.8 | NA | 5 |
| 8 | FE-8 | 3.3 | 2.4 | NA | NA | NA | 5 |
| 9 | FE-9 | 3.2 | 3.0 | 0.8 | NA | NA | 5 |
| CE-6 | CFE-6 | 3.5 | 6.6 | 0.3 | NA | NA | 5 |
| 10 | FE-10 | 3.2 | 1.3 | 0.4 | NA | NA | 5 |
| 11 | FE-11 | 3.3 | 1.2 | 0.4 | 0.5 | 0.4 | 5 |
| 12 | FE-12 | 3.6 | 1.1 | 0.6 | NA | NA | 5 |
| 13 | FE-13 | 3.6 | 3.3 | NA | NA | NA | 5 |

[1]Rating of 5 is excellent; Rating of 1 is very poor.
"NA" refers to data not available.

EXAMPLES 14-17 AND COMPARATIVE EXAMPLES CE-7 AND CE-8; COMPATIBILITY OF CLEANERS WITH EXPOSED METALS

Formulation examples FE-14 to FE-17 and comparative formulation examples CFE-7 and CFE-8 were tested for cleaning ability according to General Procedure 2 and for materials compatibility according to General Procedure 3 at 65° C. for 4 minutes. Table 5 sets forth the cleaning compositions. "Pol-BG" as set forth in Table 5 refers to polyhexamethylene biguanide, hydrochloride (see the structure below, n=12).

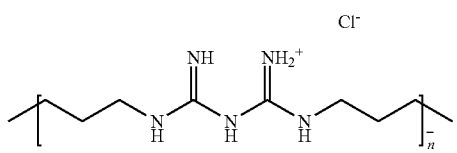

Polyhexamethylene Biguanide (Pol-BG), Hydrochloride

The etch rates (Angstroms/minute) of Co, W, TiOx, SiN, SiC, and ILD (where available) for the cleaning compositions are shown in Table 6.

TABLE 5

| Form. Ex. | Hydroxyl amine | Polyamino-polycarboxylic acid | Second Chelant | Corr. Inhib. | Organic Solvent | $H_2O$ | pH adjuster | pH (65 C.) |
|---|---|---|---|---|---|---|---|---|
| FE-14 | 5% | 0.50% DTPA | 0.01% Pol-BG | 0.20% 5MBTA | EGBE 3% | 90.43% | 0.763% DBU | 7.86 |
| FE-15 | 5% | 0.70% DTPA | 0.01% Pol-BG | 0.20% 5MBTA | EGBE 4% | 89.16% | 0.933% DBU | 8.00 |
| FE-16 | 4% | 0.60% DTPA | 0.01% Pol-BG | 0.30% 5MBTA | EGBE 4% | 90.28% | 0.81% DBU | 7.9 |
| FE-17 | 5% | 0.50% DTPA | 0.01% Pol-BG | 0.25% 5MBTA | EGBE 5% | 88.50% | 0.74% DBU | 8.3 |
| CFE-7 | 5% | 0.60% DTPA | None | 0.20% 5MBTA | EGBE 3% | 90.44% | 0.763% DBU | 8.00 |
| CFE-8 | 4% | 0.60% DTPA | None | 0.25% 5MBTA | EGBE 5% | 88.50% | 0.74% DBU | 8.30 |

TABLE 6

| Form. Ex. | TiOx (A/min) | W (A/min) | Co (A/min) | SiN (A/min) | ILD (A/min) | Cleaning[1] |
|---|---|---|---|---|---|---|
| FE-14 | 2.1 | 0.7 | 0.02 | 1.4 | NA | 5 |
| FE-15 | 1.8 | 0.7 | 0.03 | 1.1 | NA | 5 |
| FE-16 | 1.2 | 0.7 | 0.01 | 2.3 | 0.00 | 5 |
| FE-17 | 0.9 | 0.6 | 0.01 | 1.5 | 0.00 | 4 |
| CFE-7 | 2.1 | 2.4 | 0.10 | 0.9 | 0.00 | 5 |
| CFE-8 | 1.9 | 2.1 | 0.00 | 1.2 | NA | 5 |

[1]Rating of 5 is excellent; rating of 1 is very poor.
"NA" refers to data not available.

All formulations in Table 6 showed excellent cleaning ability. However comparative formulations CFE-7 and CFE-8 showed unacceptably high W etch rates. Formulation Examples FE-14 to FE17 showed significantly decreased W etch rates, while maintaining acceptable etch rates on other materials and having excellent cleaning.

FORMULATION EXAMPLES 18-38

To further elaborate on the compositions of this disclosure, additional cleaning compositions are described in Table 7. The "second chelant" in Table 7 refers to the polymeric biguanides having Structure (IV) (i.e., Polymers 1-8 below) or polymeric biguanides containing pendant biguanide groups (i.e., Polymers 9-12 below). Specifically, Polymers 1-8 are those of Structure (IV) in which n, $R^{25}$ and $R^{26}$ are defined below.

| Polymer # | $R^{25}$ | $R^{26}$ | n |
|---|---|---|---|
| 1 | H | $C_4$-alkylene | 10 |
| 2 | H | $C_8$-alkylene | 15 |
| 3 | H | $C_{10}$-alkylene | 20 |
| 4 | H | $C_6$-alkylene | 100 |
| 5 | H | $C_6$-alkylene | 200 |
| 6 | H | $C_6$-alkylene | 300 |
| 7 | H | —$CH_2CH_2$—O—$CH_2CH_2$— | 20 |
| 8 | H | —$CH_2CH_2$—$CH(CO_2H)$—$CH_2CH_2$— | 20; |

Polymers 9-12 are those with pendant biguanide moieties and are listed below:

| 9 | polyvinylbiguanide |
| 10 | polyallylbiguanide |
| 11 | poly(N-vinylbiguanide) |
| 12 | poly(allylbiguanide-co-allylamine) |

TABLE 7

| Form. Ex. | Hydroxyl amine | Polyamino-polycarboxylic acid | Second Chelant | Corr. Inhib. | Organic Solvent | H$_2$O |
|---|---|---|---|---|---|---|
| FE-18 | 5.5% | 0.50% DTPA | Polymer 1 0.01% | 0.25% 5MBTA | EGBE 5% | 88.74% |
| FE-19 | 5.5% | 0.50% DTPA | Polymer 2 0.01% | 0.25% 5MBTA | EGBE 5% | 88.74% |
| FE-20 | 5.5% | 0.50% DTPA | Polymer 3 0.02% | 0.25% 5MBTA | EGBE 5% | 88.73% |
| FE-21 | 5.5% | 0.50% DTPA | Polymer 4 0.04% | 0.25% 5MBTA | EGBE 5% | 88.71% |
| FE-22 | 5.5% | 0.50% DTPA | Polymer 5 0.06% | 0.25% 5MBTA | EGBE 5% | 88.69% |
| FE-23 | 5.5% | 0.50% DTPA | Polymer 6 0.08% | 0.25% 5MBTA | EGBE 5% | 88.67% |
| FE-24 | 5.5% | 0.50% DTPA | Polymer 7 0.10% | 0.25% 5MBTA | EGBE 5% | 88.65% |
| FE-25 | 5.5% | 0.50% DTPA | Polymer 8 0.50% | 0.25% 5MBTA | EGBE 5% | 88.25% |
| FE-26 | 5.5% | 0.50% DTPA | Polymer 9 1.0% | 0.25% 5MBTA | EGBE 5% | 87.75% |
| FE-27 | 5.5% | 0.50% DTPA | Polymer 10 1.8% | 0.25% 5MBTA | EGBE 5% | 86.95% |
| FE-28 | 5.5% | 0.50% DTPA | Polymer 11 0.01% | 0.05% BTA | 2-ethoxy-1-propanol 2% | 91.94% |
| FE-29 | 5.5% | 0.50% DTPA | 1-(4-nitrophenyl) biguanide 0.01% | 0.10% 1-hydroxy BTA | diethylene glycol monobutylether 10% | 83.89% |
| FE-30 | 5.5% | 0.50% DTPA | 1,6-bis-(4-chlorobenzyl biguanido)-hexane 0.01% | 0.40% 4-methyl BTA | ethylene glycol mono n-propyl ether 15% | 78.59% |
| FE-31 | 5.5% | 0.50% DTPA | alexidine 0.01% | 0.50% 5-amino tetrazole | diethylene glycol 10% | 83.49% |
| FE-32 | 5.5% | 0.50% DTPA | 2,4-diamino-butyric acid 0.01% | 1.0% 4-nitro BTA | 3-methoxy-1-butanol 5% | 87.99% |
| FE-33 | 1.0% | 0.50% EDTA | histidine 0.01% | 0.25% 5MBTA | EGBE 5% | 93.24% |
| FE-34 | 2.5% | 0.01% diaminopropanol tetraacetic acid | Polymer 12 0.01% | 0.25% 5MBTA | EGBE 5% | 92.23% |
| FE-35* | 7.0% | 0.75% ethylendiamine dipropionic acid | 1-hexyl-5-benzyl biguanide 0.01% | 0.25% 5MBTA | EGBE 5% | 86.49% |
| FE-36** | 10% | 1.0% ethylendiamine diacetic acid | Polymer 1 0.01% | 0.25% 5MBTA | EGBE 5% | 83.34% |
| FE-37 | 1.0% | 0.50% DTPA | butylene diamine 0.1% | 0.25% 5MBTA | EGBE 5% | 93.15% |
| FE-38 | 2.5% | 0.40% DTPA | triethylene-tetramine 0.5% | 0.25% 5MBTA | EGBE 5% | 91.35% |

*Formulation also contains 0.5% DBU.
**Formulation also contains 0.4% tetramethylammonium hydroxide (TMAH).

What is claimed is:

1. A cleaning composition, comprising:
   1) hydroxylamine in an amount of from about 0.5% to about 20% by weight of the composition;
   2) a chelating agent comprising at least two nitrogen containing groups, wherein the at least two nitrogen groups comprise a primary amino group and a secondary amino group, and the chelating agent is in an amount of from about 0.01% to about 1.8% by weight of the composition;
   3) an alkylene glycol; and
   4) water;
   wherein the composition has a pH of from about 7 to about 11.

2. The composition of claim 1, wherein the composition is non-corrosive.

3. The composition of claim 1, wherein the hydroxylamine is in an amount of from about 5% to about 15% by weight of the composition.

4. The composition of claim 1, wherein the chelating agent is in an amount of from about 0.01% to about 1% by weight of the composition.

5. The composition of claim 1, wherein the alkylene glycol is in an amount of at most about 30% by weight of the composition.

6. The composition of claim 1, wherein the alkylene glycol is in an amount of at most about 20% by weight of the composition.

7. The composition of claim 1, wherein the alkylene glycol is in an amount of at least about 1% by weight of the composition.

8. The composition of claim 1, wherein the composition comprises a metal corrosion inhibitor.

9. The composition of claim 8, wherein the metal corrosion inhibitor comprises a substituted or unsubstituted benzotriazole.

10. The composition of claim 9, wherein the benzotriazole is in an amount of from about 0.05% to about 1% by weight of the composition.

11. The composition of claim 1, wherein the water is in an amount of at most about 90% by weight of the composition.

12. The composition of claim 1, wherein the composition comprises a surfactant or an additional chelating agent.

13. The composition of claim 1, wherein
the hydroxylamine is in an amount of from about 5% to about 15% by weight of the composition;
the chelating agent is in an amount of from about 0.01% to about 1% by weight of the composition;
the alkylene glycol is in an amount of at most about 30% by weight of the composition; and
the water is in an amount of at most about 90% by weight of the composition.

14. The composition of claim 13, wherein the alkylene glycol is in an amount of at least about 1% by weight of the composition.

15. The composition of claim 13, wherein the composition comprises a metal corrosion inhibitor.

16. The composition of claim 15, wherein the metal corrosion inhibitor comprises a substituted or unsubstituted benzotria.zole.

17. The composition of claim 16, wherein the benzotdazole is in an amount of from about 0.05% to about 1% by weight of the composition.

18. The composition of claim 1, wherein the composition comprises a surfactant or an additional chelating agent.

19. A cleaning composition, comprising:
1) hydroxylamine in an amount of from about 0.5% to about 20% by weight of the composition;
2) a. chelating agent comprising at least two nitrogen containing groups, wherein the at least two nitrogen groups comprise a primary amino group and a secondary amino group, and the chelating agent is in an amount of from about 0.01% to about 1% by weight of the composition;
3) a metal corrosion inhibitor; and
4) water;
wherein the pH of the composition is from about 7 to about 11.

20. The composition of claim 19, wherein the hydroxylamine is in an amount of from about 5% to about 15% by weight of the composition.

21. The composition of claim 19, wherein the metal corrosion inhibitor comprises a substituted or unsubstituted benzotriazole.

22. The composition of claim 21, wherein the benzotriazole is in an amount of from about 0.05% to about 1% by weight of the composition.

23. The composition of claim 1, wherein the water is in an amount of at most about 90% by weight of the composition.

24. The composition of claim 1, further comprising an alkylene glycol in an amount of at most about 30% by weight of the composition.

25. The composition of claim 24, wherein the alkylene glycol is in an amount of at least about 1% by weight of the composition.

26. The composition of claim 24, wherein
the hydroxyl amine is in an amount of from about 5% to about 15% by weight of the composition;
the metal corrosion inhibitor is in an amount of from about 0.05% to about 1% by weight of the composition;
the alkylene glycol is in an amount of from about 1% to about 30% by weight of the composition; and
the water is in an amount of at most about 90% by weight of the composition.

27. A cleaning composition, comprising:
1) hydroxylamine in an amount of from about 0.5% to about 20% by weight of the composition;
2) a chelating agent comprising at least two nitrogen containing groups, wherein each of the two nitrogen groups, independently, is a primary amino group or a secondary amino group, and the chelating agent is in an amount of from about 0.01% to about 1.8% by weight of the composition;
3) an alkylene glycol; and
4) water;
wherein the composition has a p1:1 of from about 7 to about 11.

28. The composition of claim 27, further comprising a metal corrosion inhibitor or an additional chelating agent.

* * * * *

UNITED STATES PATENT AND TRADEMARK OFFICE
CERTIFICATE OF CORRECTION

PATENT NO. : 11,401,487 B2
APPLICATION NO. : 17/582077
DATED : August 2, 2022
INVENTOR(S) : Tomonori Takahashi et al.

Page 1 of 1

It is certified that error appears in the above-identified patent and that said Letters Patent is hereby corrected as shown below:

On the Title Page

Column 1 (Assignee), Line 1, delete "Electronics" and insert -- Electronic --

In the Claims

Column 29
Line 32, in Claim 16, delete "benzotria.zole." and insert -- benzotriazole. --
Lines 33-34, in Claim 17, delete "benzotdazole" and insert -- benzotriazole --
Line 41, in Claim 19, delete "a. chelating" and insert -- a chelating --

Column 30
Line 23, in Claim 26, delete "hydroxyl amine" and insert -- hydroxylamine --
Line 42, in Claim 27, delete "p1:1" and insert -- pH --

Signed and Sealed this
Twenty-seventh Day of September, 2022

Katherine Kelly Vidal
*Director of the United States Patent and Trademark Office*